United States Patent
Yamazaki

(10) Patent No.: US 9,954,114 B2
(45) Date of Patent: Apr. 24, 2018

(54) SEMICONDUCTOR DEVICE INCLUDING OXIDE SEMICONDUCTOR LAYER

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/276,921

(22) Filed: Sep. 27, 2016

(65) Prior Publication Data

US 2017/0018648 A1    Jan. 19, 2017

Related U.S. Application Data

(63) Continuation of application No. 14/935,552, filed on Nov. 9, 2015, now Pat. No. 9,472,681, which is a (Continued)

(30) Foreign Application Priority Data

Jul. 6, 2012 (JP) ................................. 2012-152794

(51) Int. Cl.
     *H01L 29/10*      (2006.01)
     *H01L 29/786*      (2006.01)
     (Continued)

(52) U.S. Cl.
     CPC .... *H01L 29/7869* (2013.01); *H01L 21/02565* (2013.01); *H01L 21/02631* (2013.01);
     (Continued)

(58) Field of Classification Search
     CPC .................................................. H01L 29/7869
     (Continued)

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2141743 A    1/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Jami M Valentine
(74) *Attorney, Agent, or Firm* — Fish & Richardson P.C.

(57) ABSTRACT

The electrical characteristics of a transistor including an oxide semiconductor layer are varied by influence of an insulating film in contact with the oxide semiconductor layer, that is, by an interface state between the oxide semiconductor layer and the insulating film. A first oxide semiconductor layer S1, a second oxide semiconductor layer S2, and a third oxide semiconductor layer S3 are sequentially stacked, so that the oxide semiconductor layer through which carriers flow is separated from the gate insulating film containing silicon. The thickness of the first oxide semiconductor layer S1 is preferably smaller than those of the second oxide semiconductor layer S2 and the third oxide semiconductor layer S3, and is less than or equal to 10 nm, preferably less than or equal to 5 nm.

17 Claims, 18 Drawing Sheets

Related U.S. Application Data continuation of application No. 13/934,274, filed on Jul. 3, 2013, now Pat. No. 9,190,525.

(51) Int. Cl.
*H01L 29/423* (2006.01)
*H01L 29/49* (2006.01)
*H01L 21/02* (2006.01)
*H01L 29/24* (2006.01)
*H01L 29/66* (2006.01)

(52) U.S. Cl.
CPC ........ *H01L 29/24* (2013.01); *H01L 29/42384* (2013.01); *H01L 29/4908* (2013.01); *H01L 29/66969* (2013.01); *H01L 29/78648* (2013.01); *H01L 29/78696* (2013.01)

(58) Field of Classification Search
USPC .......................... 257/43, 57, E21.4; 438/104
See application file for complete search history.

(56) References Cited

U.S. PATENT DOCUMENTS

| | | | |
|---|---|---|---|
| 6,236,076 B1 * | 5/2001 | Arita ................ | H01L 21/28291 257/213 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,994,500 B2 | 8/2011 | Kim et al. | |
| 8,058,645 B2 | 11/2011 | Jeong et al. | |
| 8,148,779 B2 | 4/2012 | Jeong et al. | |
| 8,158,880 B1 * | 4/2012 | Girt ....................... | B82Y 20/00 136/255 |
| 8,188,480 B2 | 5/2012 | Itai | |
| 8,202,365 B2 | 6/2012 | Umeda et al. | |
| 8,203,143 B2 | 6/2012 | Imai | |
| 8,502,221 B2 | 8/2013 | Yamazaki | |
| 8,669,551 B2 | 3/2014 | Kim et al. | |
| 8,692,252 B2 | 4/2014 | Takata et al. | |
| 8,890,159 B2 | 11/2014 | Yamazaki et al. | |
| 8,952,381 B2 | 2/2015 | Yamazaki | |
| 9,035,313 B2 | 5/2015 | Jeong et al. | |
| 9,059,295 B2 | 6/2015 | Yamazaki | |
| 9,318,613 B2 | 4/2016 | Yamazaki | |
| 2001/0046027 A1 | 11/2001 | Tai et al. | |
| 2002/0034861 A1 * | 3/2002 | Iwata ....................... | C30B 23/02 438/483 |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 * | 5/2006 | Saito ................ | H01L 27/14601 250/338.4 |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065838 A1 * | 3/2010 | Yamazaki ............ | H01L 27/1225 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0181565 A1 * | 7/2010 | Sakata .................. | C23C 14/086 257/43 |
| 2010/0320458 A1 | 12/2010 | Umeda et al. | |
| 2010/0320459 A1 | 12/2010 | Umeda et al. | |
| 2011/0062436 A1 | 3/2011 | Yamazaki et al. | |
| 2011/0140095 A1 * | 6/2011 | Kim .................... | H01L 29/7869 257/43 |
| 2011/0175082 A1 * | 7/2011 | Kim .................... | H01L 27/1225 257/43 |
| 2011/0193083 A1 | 8/2011 | Kim et al. | |
| 2012/0119205 A1 * | 5/2012 | Taniguchi ......... | H01L 29/78693 257/43 |

(56) References Cited

U.S. PATENT DOCUMENTS

| | | | |
|---|---|---|---|
| 2012/0161126 A1* | 6/2012 | Yamazaki | H01L 27/10873 257/43 |
| 2012/0256179 A1 | 10/2012 | Yamazaki et al. | |
| 2012/0319183 A1* | 12/2012 | Yamazaki | H01L 29/7782 257/288 |
| 2013/0320330 A1 | 12/2013 | Yamazaki | |
| 2013/0320334 A1 | 12/2013 | Yamazaki et al. | |
| 2014/0210835 A1* | 7/2014 | Hong | H01L 29/78696 345/530 |
| 2015/0311347 A1 | 10/2015 | Yamazaki | |
| 2016/0225908 A1 | 8/2016 | Yamazaki | |

FOREIGN PATENT DOCUMENTS

| | | | |
|---|---|---|---|
| EP | 2226847 A | | 9/2010 |
| EP | 2544237 A | | 1/2013 |
| EP | 3217435 A | | 9/2017 |
| JP | 60-198861 A | | 10/1985 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-265818 A | | 11/1988 |
| JP | 05-251705 A | | 9/1993 |
| JP | 08-264794 A | | 10/1996 |
| JP | 11-505377 | | 5/1999 |
| JP | 2000-044236 A | | 2/2000 |
| JP | 2000-150900 A | | 5/2000 |
| JP | 2002-076356 A | | 3/2002 |
| JP | 2002-289859 A | | 10/2002 |
| JP | 2003-086000 A | | 3/2003 |
| JP | 2003-086808 A | | 3/2003 |
| JP | 2004-103957 A | | 4/2004 |
| JP | 2004-273614 A | | 9/2004 |
| JP | 2004-273732 A | | 9/2004 |
| JP | 2009-218562 A | | 9/2009 |
| JP | 2010-016348 A | | 1/2010 |
| JP | 2011-086923 A | | 4/2011 |
| JP | 2011-124360 A | | 6/2011 |
| JP | 2011-155249 A | | 8/2011 |
| JP | 2011-228689 A | | 11/2011 |
| JP | 2011-228695 A | | 11/2011 |
| WO | WO-2004/114391 | | 12/2004 |
| WO | WO-2011/033936 | | 3/2011 |
| WO | WO-2011/122363 | | 10/2011 |
| WO | WO-2011/122364 | | 10/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3$, and $Ga_2O_3(ZnO)m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium of Technical Papers, May 31, 2009, vol. 40, pp. 899-902.

Kanno.H et al., "White Stacked Electrophosphorecent Organic Light-Emitting Devices Employing MOO as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

(56) References Cited

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009. pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe Ga, or Al; B: Mg, Mn, Fe, Ni, Cu,or Zn] at Temperatures Over 1000° C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW'08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nathan.A et al., "Amorphous Oxide TFTs: Progress and Issues", SID Digest '12 : SID International Symposium Digest of Technical Papers, Jun. 5, 2012, vol. 43, No. 1, pp. 1-4.

\* cited by examiner

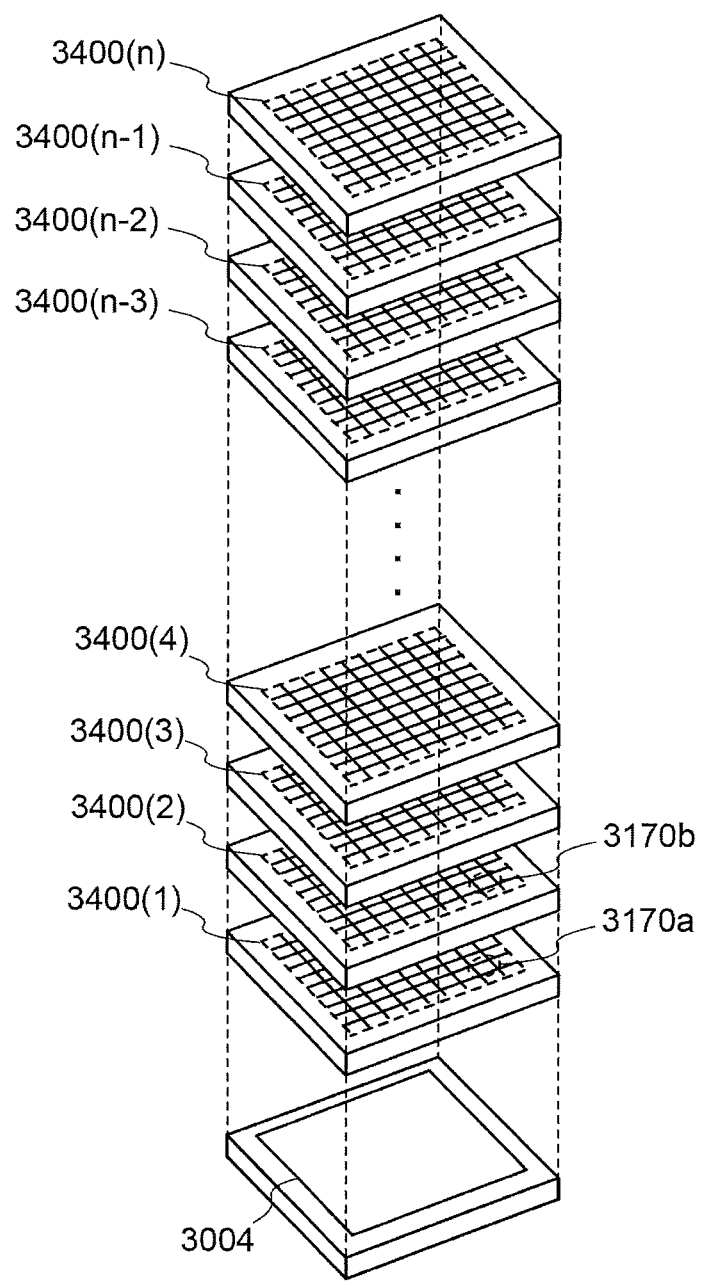

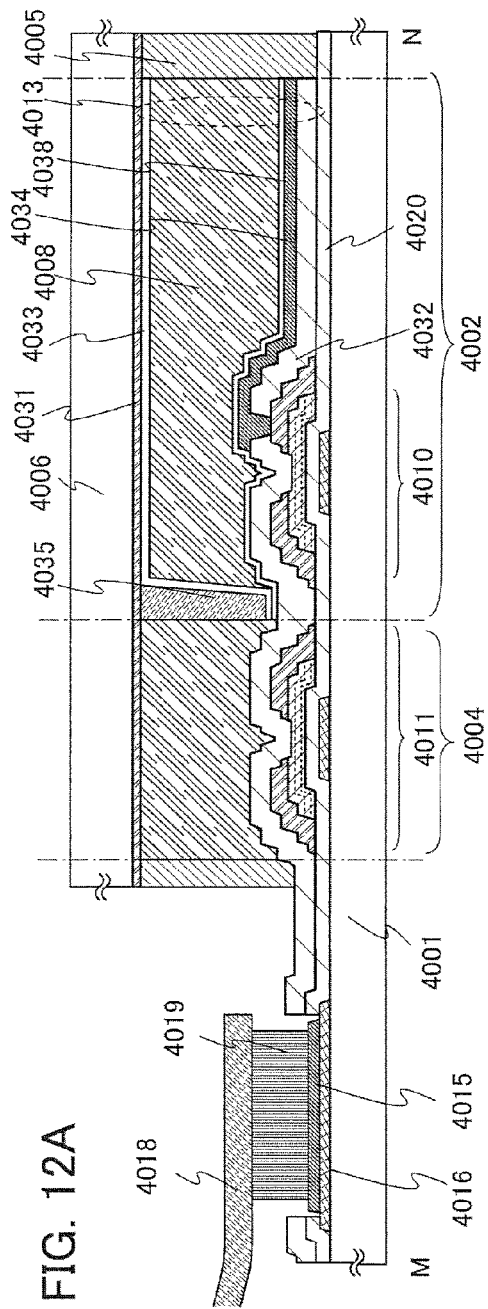
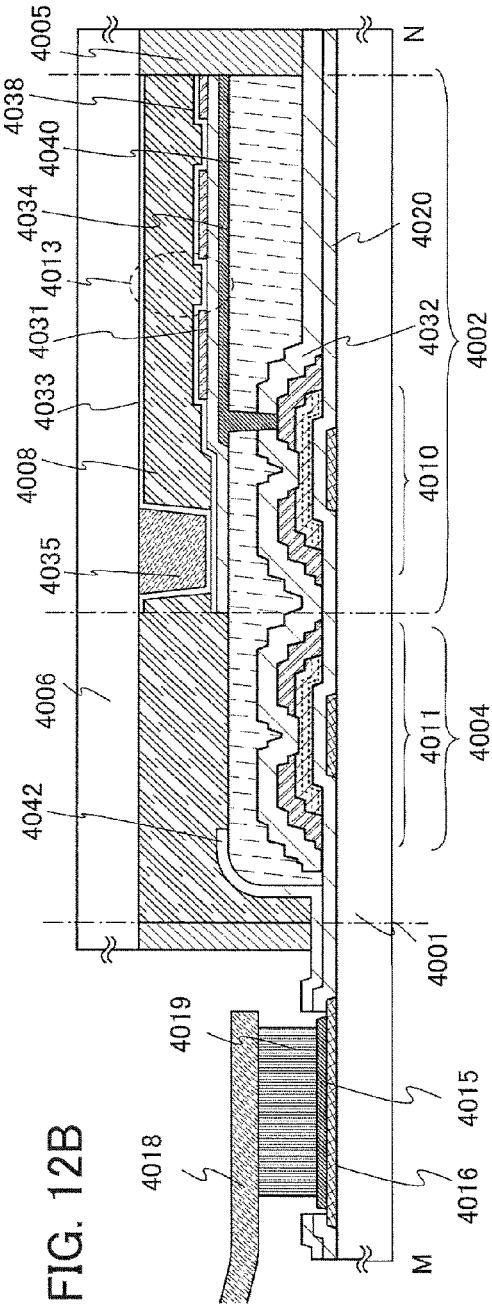
FIG. 12A
FIG. 12B 2003
2002
2001
2000

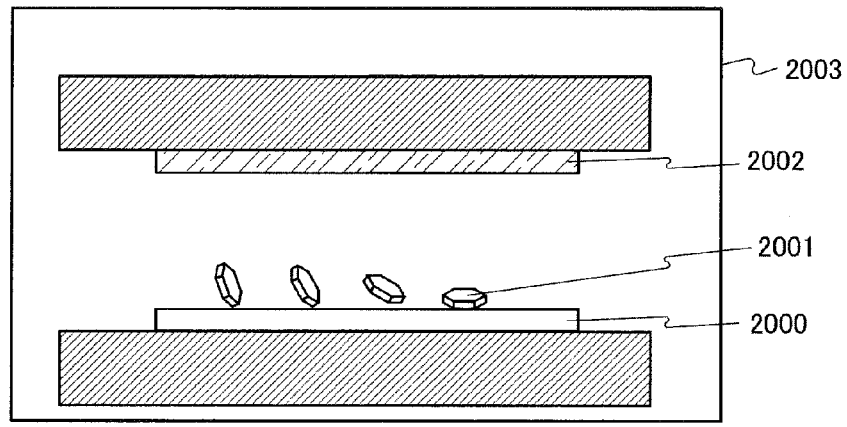
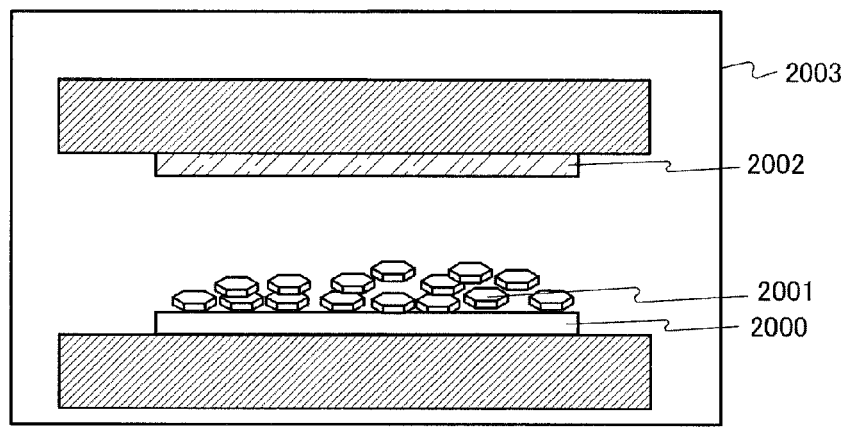
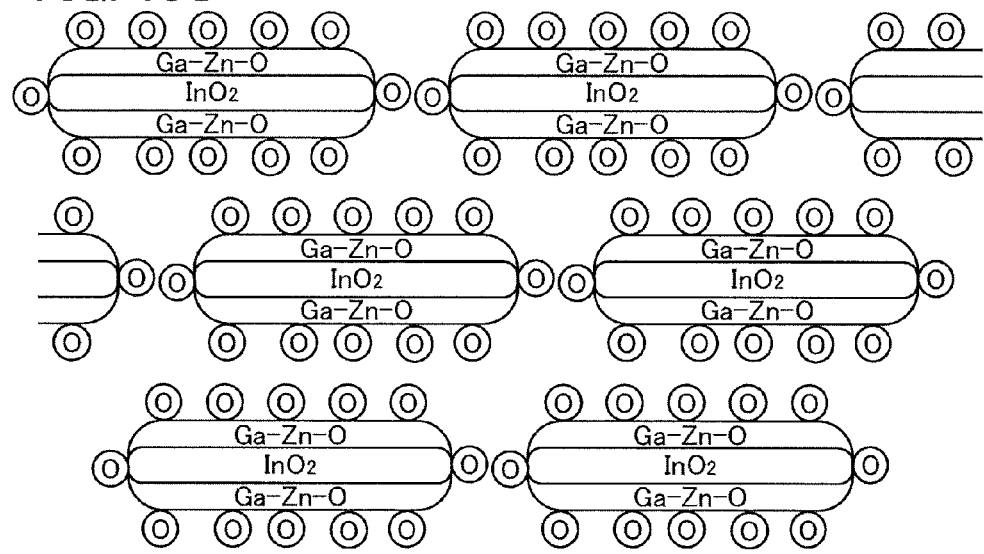

SEMICONDUCTOR DEVICE INCLUDING OXIDE SEMICONDUCTOR LAYER

CROSS-REFERENCE TO RELATED APPLICATIONS

This application is a continuation of U.S. application Ser. No. 14/935,552, filed Nov. 9, 2015, now allowed, which is a continuation of U.S. application Ser. No. 13/934,274, filed Jul. 3, 2013, now U.S. Pat. No. 9,190,525, which claims the benefit of a foreign priority application filed in Japan as Serial No. 2012-152794 on Jul. 6, 2012, all of which are incorporated by reference.

BACKGROUND OF THE INVENTION

1. Field of the Invention

The present invention relates to a semiconductor device including an oxide semiconductor and a manufacturing method of the semiconductor device.

In this specification, a semiconductor device means a device which can function by utilizing semiconductor characteristics, and an electrooptic device, a semiconductor circuit, and an electronic device are all semiconductor devices.

2. Description of the Related Art

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, or a memory is mounted on a circuit board, for example, a printed wiring board, to be used as one of components of a variety of electronic devices.

A technique for manufacturing a transistor by using an oxide semiconductor film for a channel formation region, or the like has been attracting attention. Examples of such a transistor include a transistor in which zinc oxide (ZnO) is used as an oxide semiconductor film and a transistor in which $InGaO_3(ZnO)_m$ is used as an oxide semiconductor film. A technique in which a switching element, such as a transistor, in which a channel formation region is formed in an oxide semiconductor film is used for manufacturing an active matrix display device has also been developed.

Patent Document 1 discloses a three-layer structure in which a first multi-component oxide semiconductor layer is provided over a substrate, a one-component oxide semiconductor layer is stacked over the first multi-component oxide semiconductor layer, and a second multi-component oxide semiconductor layer is stacked over the one-component oxide semiconductor layer.

Non-Patent Document 1 discloses a transistor having a stack of oxide semiconductors.

REFERENCE

Patent Document

[Patent Document 1] Japanese Published Patent Application No. 2011-155249

Non-Patent Document

[Non-Patent Document 1] Arokia Nathan et al., "Amorphous Oxide TFTs: Progress and issues", SID 2012 Digest pp. 1-4.

SUMMARY OF THE INVENTION

The electrical characteristics of a transistor including an oxide semiconductor layer are varied by influence of an insulating film in contact with the oxide semiconductor layer, that is, by an interface state between the oxide semiconductor layer and the insulating film.

For example, interface scattering of carriers at the interface between the oxide semiconductor layer and the insulating layer in contact with the oxide semiconductor layer causes degradation of the field-effect mobility of the transistor. Moreover, if a trap level (also referred to as an interface state) exists at that interface, the trap level causes a change in the electrical characteristics (e.g., the threshold voltage, the subthreshold swing (S value), or the field-effect mobility) of the transistor.

An object of one embodiment of the present invention is to provide a structure of a transistor having high field-effect mobility.

Another object of one embodiment of the present invention is to provide a highly reliable semiconductor device including an oxide semiconductor by preventing a change in its electrical characteristics.

Thus, in order that an oxide semiconductor layer through which carriers flow is not in contact with a gate insulating film containing silicon, a structure in which the oxide semiconductor layer through which carriers flow is separated from the gate insulating film containing silicon is employed.

Specifically, a first oxide semiconductor layer S1, a second oxide semiconductor layer S2, and a third oxide semiconductor layer S3 are sequentially stacked, so that a structure having an energy band diagram (which is a schematic diagram) shown in FIG. 1B is formed. In the energy band diagram shown in FIG. 1B, the energy level of the bottom of the conduction band in the second oxide semiconductor layer S2 is lower than those of the bottoms of the conduction band in the first oxide semiconductor layer S1 and the third oxide semiconductor layer S3. Further, the energy band diagram preferably has a round well structure in which the energy of the bottom of a conduction band is continuously changed to the energy of the bottom of an adjacent conduction band.

A structure of one embodiment of the present invention disclosed in this specification is a semiconductor device including a first insulating layer over an insulating surface, a first oxide semiconductor layer over the first insulating layer, a second oxide semiconductor layer over the first oxide semiconductor layer, a third oxide semiconductor layer over the second oxide semiconductor layer, and a second insulating layer over the third oxide semiconductor layer. At the interface between the second oxide semiconductor layer and the first oxide semiconductor layer and in the vicinity of the interface, the energy of the bottom of the conductive band of the first oxide semiconductor layer is continuously changed to the energy of the bottom of the conductive band of the second oxide semiconductor layer. In other words, the energy of the bottom of the conduction band of the first oxide semiconductor layer S1 is connected to the energy of the bottom of the conduction band of the second oxide semiconductor layer S2 at the interface between the first oxide semiconductor layer S1 and the second oxide semiconductor layer S2 and in the vicinity of the interface, so that a curved band diagram shown in FIG. 1B is made. This is because the second oxide semiconductor layer S2 contains an element common to the first oxide semiconductor layer S1, and oxygen moves between the first oxide semiconductor layer S1 and the second oxide semiconductor layer S2 to form a mixed layer. On the other hand, in the case where the energy of the bottom of the conduction band of a layer is not continuously changed to the energy of the bottom of the conduction band of another layer at the interface between the two layers and in the vicinity of the interface, the energy level is steeply changed so that a step-like band diagram is made.

In the above structure, it is preferable that materials and compositions of the second oxide semiconductor layer and the third oxide semiconductor layer be adjusted so that the energy of the bottom of the conductive band of the second oxide semiconductor layer is continuously changed to the conductive band of the third oxide semiconductor layer at the interface between the second oxide semiconductor layer and the third oxide semiconductor layer and in the vicinity of the interface.

Further, in the above structure, the composition of the second oxide semiconductor layer is different from those of the first and third oxide semiconductor layers.

As a material of the first oxide semiconductor layer S1, a material which can be represented as $M1_aM2_bM3_cO_x$ (a is a real number greater than or equal to 0 and less than or equal to 2, b is a real number greater than 0 and less than or equal to 5, c is a real number greater than or equal to 0 and less than or equal to 5, and x is an arbitrary real number) is used. Ga, Mg, Hf, Al, Zr, Sn, or the like can be used as the constituent element M2 to function as a stabilizer for reducing the number of oxygen vacancies in an oxide semiconductor. As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained. As the constituent element M1, indium or the like is used. As the constituent element M3, zinc or the like is used.

Typically, for the first oxide semiconductor layer S1, a gallium oxide film, a gallium zinc oxide film, or a material film in which the content of the constituent element M2 is higher than the content of the constituent element M1 is used. For example, an In—Ga—Zn-based oxide film which is deposited using a sputtering target having any of atomic ratios of In:Ga:Zn=1:3:2, In:Ga:Zn=1:4:2, and In:Ga:Zn=1:5:4 is used. In forming the first oxide semiconductor layer, deposition is preferably performed by a sputtering method in a mixed atmosphere containing more oxygen than a rare gas and more preferably in an oxygen atmosphere (oxygen: 100%), and the resulting oxide semiconductor layer can also be referred to as a first I-type oxide semiconductor layer. The first I-type oxide semiconductor layer is a highly purified oxide semiconductor layer that contains impurities other than the main components of the oxide semiconductor layer as little as possible and is an I-type (intrinsic) oxide semiconductor or close thereto. In such an oxide semiconductor layer, the Fermi level (Ef) can be at the same level as the intrinsic Fermi level (Ei).

Further, the thickness of the first oxide semiconductor layer S1 is preferably smaller than those of the second oxide semiconductor layer S2 and the third oxide semiconductor layer S3, and is less than or equal to 10 nm, preferably less than or equal to 5 nm.

For the second oxide semiconductor layer S2, a material which can be represented as $M4_dM5_eM6_fO_x$ (d is a real number greater than 0 and less than or equal to 5, e is a real number greater than or equal to 0 and less than or equal to 3, f is a real number greater than 0 and less than or equal to 5, and x is an arbitrary positive number) is used. Ga, Mg, Hf, Al, Zr, Sn, or the like can be used as the constituent element M5 to function as a stabilizer for reducing the number of oxygen vacancies in an oxide semiconductor. As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained. As the constituent element M4, indium or the like is used. As the constituent element M6, zinc or the like is used. Typically, a material film in which the content of the constituent element M4 is higher than the content of the constituent element M5 is used. For example, an In—Ga—Zn-based oxide film which is deposited using a sputtering target having an atomic ratio of In:Ga:Zn=3:1:2 is used. In forming the second oxide semiconductor layer, deposition is preferably performed by a sputtering method in a mixed atmosphere containing more oxygen than a rare gas and more preferably in an oxygen atmosphere (oxygen: 100%), and the resulting oxide semiconductor layer can also be referred to as a second I-type oxide semiconductor layer. The second I-type oxide semiconductor layer is a highly purified oxide semiconductor layer that contains impurities other than the main components of the oxide semiconductor layer as little as possible and is an I-type (intrinsic) oxide semiconductor or close thereto. In this manner, the Fermi level ($E_F$) can be equal to the intrinsic Fermi level ($E_i$).

For the third oxide semiconductor layer S3, a material which can be represented as $M7_gM8_hM9_iO_x$ (g is a real number greater than or equal to 0 and less than or equal to 2, h is a real number greater than 0 and less than or equal to 5, i is a real number greater than or equal to 0 and less than or equal to 5, and x is an arbitrary real number) is used. Ga, Mg, Hf, Al, Zr, Sn, or the like can be used as the constituent element M8 to function as a stabilizer for reducing the number of oxygen vacancies in an oxide semiconductor. As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained. As the constituent element M7, indium or the like is used. As the constituent element M9, zinc or the like is used. Typically, a material film in which the content of the constituent element M7 is substantially equal to the content of the constituent element M8 is used. For example, an In—Ga—Zn-based oxide film which is deposited using a sputtering target having an atomic ratio of In:Ga:Zn=1:1:1 is used. In forming the third oxide semiconductor layer, deposition is preferably performed by a sputtering method in a mixed atmosphere containing more oxygen than a rare gas and more preferably in an oxygen atmosphere (oxygen: 100%), and the resulting oxide semiconductor layer can also be referred to as a third I-type oxide semiconductor layer.

In the case of a bottom-gate transistor, a gate electrode layer is provided between the insulating surface and the first insulating layer in the above structure.

On the other hand, in the case of a top-gate transistor, a gate electrode layer is provided over the second insulating layer in the above structure.

Further, in the case of a dual-gate transistor including gate electrode layers over and below the first, second, and third oxide semiconductor layers, a first gate electrode layer is provided between the insulating surface and the first insulating layer, and a second gate electrode layer is provided over the second insulating layer in the above structure.

The first, second, or third oxide semiconductor layer is in a single crystal state, a polycrystalline (also referred to as polycrystal) state, an amorphous state, or the like.

The first, second, or third oxide semiconductor layer is preferably a c-axis aligned crystalline oxide semiconductor (CAAC-OS) film.

The CAAC-OS film is not completely single crystal nor completely amorphous. The CAAC-OS film is one of oxide semiconductor films having a plurality of c-axis aligned crystal parts. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur. From the results of the cross-sectional TEM image and the plan TEM image, alignment is found in the crystal parts in the CAAC-OS film. Most of the crystal parts included in the CAAC-OS film each fit inside a cube whose one side is less than 100 nm. Thus, there is a case where a crystal part included in the CAAC-OS film fits a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 µm$^2$ or more, or 1000 µm$^2$ or more is observed in some cases in the plan TEM image.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

During deposition, fine sputtering particles fly from a sputtering target, and a film is formed so that the sputtering particles adhere onto the deposition-target substrate. When the temperature of the substrate is higher than or equal to 200° C., the sputtering particles are rearranged because the substrate is heated. Thus, a dense film is formed.

A phenomenon in the deposition is described in detail using FIGS. 16A to 16C, FIGS. 17A and 17B, and FIGS. 18A to 18C.

When ions collide with the surface of the sputtering target, the crystal region included in the sputtering target is cleaved along an a-b plane, and sputtered particles whose top and bottom surfaces are each aligned with a layer parallel to the a-b plane (flat-plate-like sputtered particle or pellet-like sputtered particle) are separated from the sputtering target. Assuming that the crystalline particle which is sputtered from a surface of a sputtering target 2002 and released has c-axis alignment and is a flat-plate-like sputtered particle 2001 as illustrated in FIG. 16A, a schematic model diagram in FIG. 16B can be obtained. The flat-plate-like sputtered particle is preferably a (Ga or Zn)O plane as illustrated in FIG. 16C.

When the oxygen flow rate is high and the pressure in a chamber 2003 is high during deposition, as illustrated in FIG. 17A, oxygen ions are attached onto the flat-plate-like sputtered particle and the sputtered particle can have a large amount of oxygen on its surface. Another flat-plate-like sputtered particle is stacked thereover before the attached oxygen is released; therefore, as illustrated in FIG. 18C, a large amount of oxygen can be contained in the film. This adsorbed oxygen contributes to a reduction in oxygen vacancies in the oxide semiconductor.

To form an oxide semiconductor film including a crystal region with c-axis alignment, the substrate temperature in film formation is preferably increased. However, when the substrate temperature is higher than 350° C., the adsorbed oxygen might be released as illustrated in FIG. 17B. Accordingly, the substrate temperature is set to be higher than or equal to 150° C. and lower than or equal to 350° C., preferably higher than or equal to 160° C. and lower than or equal to 230° C., and an oxygen gas is used alone as the deposition gas, whereby an oxide semiconductor film including a crystal region with c-axis alignment, i.e., a CAAC-OS film can be formed.

FIG. 18A is a model of a process in the deposition, in which one flat-plate-like sputtered particle reaches a surface of a substrate 2000 to be stabilized. As illustrated in FIG. 18A, the flat-plate-like sputtered particle reaches the substrate surface with its crystalline state maintained; thus, a CAAC-OS film is likely to be formed. Further, flat-plate-like sputtered particles are stacked as illustrated in FIG. 18B; thus, a CAAC-OS film is likely to be formed. Note that a CAAC-OS film is a film which contains much oxygen as illustrated in FIG. 18C and in which oxygen vacancies are reduced.

In the CAAC-OS film over the substrate 2000, about 2 to 20 indium atoms are aligned in a lateral direction to form a layer including indium atoms. Note that in the layer including indium atoms, more than 20 indium atoms are aligned in a lateral direction in some cases. For example, more than or equal to 2 to fewer than or equal to 50 indium atoms, more than or equal to 2 to fewer than or equal to 100 indium atoms, or more than or equal to 2 to fewer than or equal to 500 indium atoms may be aligned in a lateral direction.

Layers including indium atoms overlap with each other. The number of layers is greater than or equal to 1 and less than or equal to 20, greater than or equal to 1 and less than or equal to 10, or greater than or equal to 1 and less than or equal to 4.

As described above, a stack of the layers including indium atoms often appears to be a cluster including several indium atoms in a lateral direction and several layers in a longitudinal direction. This is because each of the sputtering particles has a flat-plate-like shape.

At least for the second oxide semiconductor layer, the CAAC-OS film is preferably used.

For the deposition of the CAAC-OS film, the following conditions are preferably used.

Reduction in the amount of impurities entering the CAAC-OS layer during the deposition can prevent the crystal state from being broken by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target is described below.

The polycrystalline In—Ga—Zn-based oxide target is made by mixing $InO_X$ powder, $GaO_Y$ powder, and $ZnO_Z$ powder in a predetermined ratio and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 5:1:5, 8:4:3, 3:1:1, 1:1:1, 4:2:3, or 3:1:2. The kinds of powder and the molar ratio for mixing powder may be determined as appropriate depending on the desired sputtering target.

With the use of the CAAC-OS film in a transistor, change in electrical characteristics of the transistor due to irradiation with visible light or ultraviolet light is small. Thus, the transistor has high reliability.

In the case where a CAAC-OS film is used for the first, second, and third oxide semiconductor layers, since the first oxide semiconductor layer has the same crystal structure as the second oxide semiconductor layer, the number of levels can be small at the interface thereof, so that high field-effect mobility can be achieved. Further, it is preferable that the second oxide semiconductor layer be formed on and in contact with the first oxide semiconductor layer that is a CAAC-OS film because the second oxide semiconductor layer formed over the first oxide semiconductor layer is easily crystallized using the first oxide semiconductor layer as a crystal seed, so that the first and second oxide semiconductor layers can have the same crystal structure.

A transistor structure with high field-effect mobility can be achieved.

BRIEF DESCRIPTION OF THE DRAWINGS

FIG. 8 is a perspective view illustrating one embodiment of the present invention.

FIGS. 12A and 12B are cross-sectional views illustrating one embodiment of the present invention.

FIGS. 18A and 18B are model diagrams during deposition, and FIG. 18C is a model diagram showing the state of the flat-plate-like sputtered particle.

DETAILED DESCRIPTION OF THE INVENTION

Hereinafter, embodiments of the present invention are described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments.

Embodiment 1

In this embodiment, one embodiment of a semiconductor device is described with reference to FIGS. 1A to 1D. In this embodiment, a structural example of a transistor including an oxide semiconductor film is described.

Figure 1A:
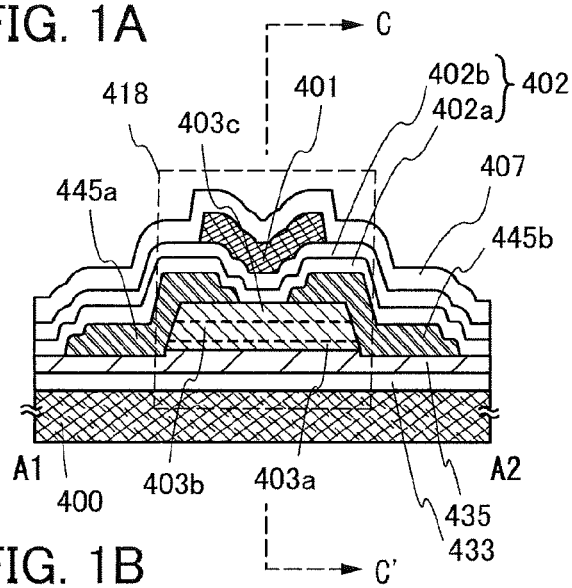
FIGS. 1A to 1D are cross-sectional views, a band diagram, and a top view illustrating one embodiment of the present invention.
Figure 1B:
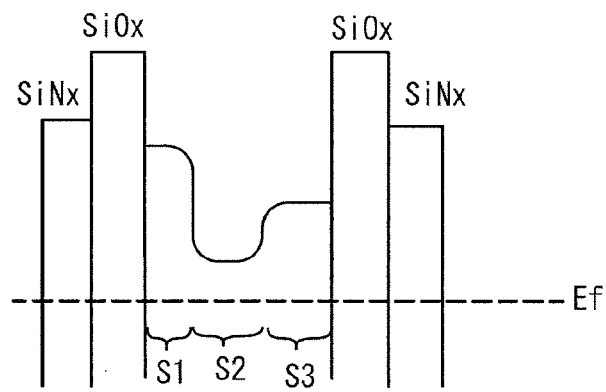
Figure 1C:
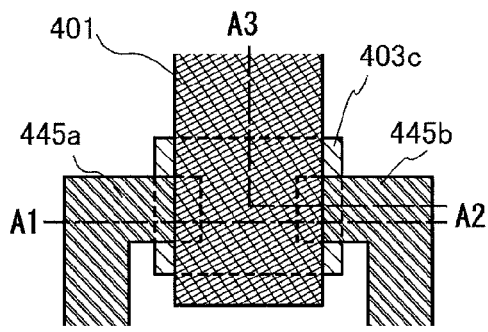
Figure 1D:
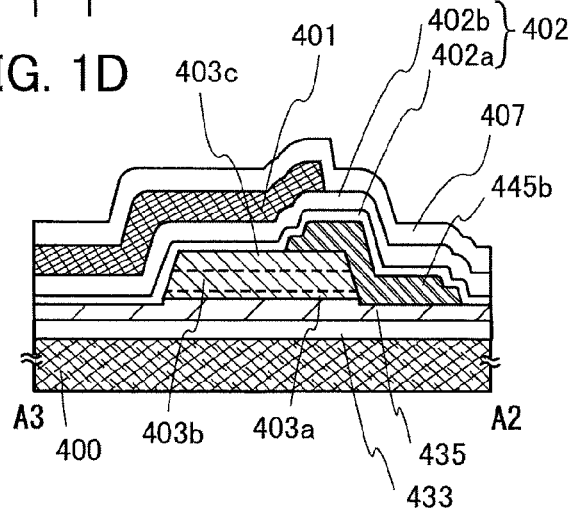

Note that the cross-sectional view of a transistor 418 in FIG. 1A corresponds to a structural view taken along a chain line A1-A2 in a top view in FIG. 1C. The cross-sectional view of the transistor 418 in FIG. 1D corresponds to a structural view taken along a chain line A2-A3 in a top view in FIG. 1C.

The transistor 418 illustrated in FIGS. 1A to 1D includes a base insulating layer having a two-layer structure over a substrate 400, three oxide semiconductor layers which are over the base insulating layer and include at least a channel formation region, electrode layers 445a and 445b which are on and in contact with the oxide semiconductor layers, a gate electrode layer 401 over the electrode layers 445a and 445b and a gate insulating layer 402 having a two-layer structure, and the insulating layer 407 over the stack of oxide semiconductor layers, the gate insulating layer 402 having a two-layer structure, and the gate electrode layer 401. The electrode layers 445a and 445b function as a source electrode layer and a drain electrode layer.

Although there is no particular limitation on a substrate which can be used as the substrate 400, it is at least necessary that the substrate have heat resistance sufficient to withstand heat treatment performed later. A single crystal semiconductor substrate or a polycrystalline semiconductor substrate of silicon, silicon carbide, or the like or a compound semiconductor substrate of silicon germanium or the like may be used as the substrate 400. Alternatively, an SOI substrate, a substrate over which a semiconductor element is provided, or the like can be used. Further alternatively, a glass substrate of barium borosilicate glass, aluminoborosilicate glass, or the like, a ceramic substrate, a quartz substrate, or a sapphire substrate can be used.

For the first layer of the base insulating layer having a two-layer structure, a nitride insulating film 433 is formed, and for the second layer of the base insulating layer, an oxide insulating film 435 is formed. For the first layer of the gate insulating layer 402 having a two-layer structure, an oxide insulating film formed using a sputtering method, a molecular beam epitaxy (MBE) method, a chemical vapor deposition (CVD) method, a pulsed laser deposition (PLD) method, an atomic layer deposition (ALD) method, or the like, as appropriate is used. For the second layer of the gate insulating layer 402, a nitride insulating film is used. As the oxide insulating layer, silicon oxide, gallium oxide, aluminum oxide, silicon oxynitride, silicon nitride oxide, hafnium oxide, tantalum oxide, or the like can be used. Further, for the nitride insulating film, an insulating layer formed of silicon nitride, silicon oxynitride, silicon nitride oxide, or the like is preferably used.

Here, silicon oxynitride means the one that contains more oxygen than nitrogen and for example, silicon oxynitride includes at least oxygen, nitrogen, and silicon at concentrations ranging from greater than or equal to 50 atomic % and less than or equal to 70 atomic %, greater than or equal to 0.5 atomic % and less than or equal to 15 atomic %, and greater than or equal to 25 atomic % and less than or equal to 35 atomic %, respectively. In the case where a substrate provided with a semiconductor element is used, a silicon nitride film is preferably used as the nitride insulating film 433, which is formed by a plasma CVD method with use of a mixed gas of silane ($SiH_4$) and nitrogen ($N_2$) as a supply gas. This silicon nitride film also functions as a barrier film, which has a function of preventing entry of hydrogen or a hydrogen compound into an oxide semiconductor layer formed later so as to improve the reliability of a semiconductor device. In the case where the silicon nitride film is formed by a plasma chemical vapor deposition (CVD) method with use of a mixed gas of silane ($SiH_4$), nitrogen ($N_2$), and ammonia ($NH_3$) as a supply gas, the amount of defects in the film can be reduced as compared with the case where the silicon nitride film is formed with use of a mixed gas of silane ($SiH_4$) and nitrogen ($N_2$) as a supply gas. When the thickness of the silicon nitride film formed with use of a mixed gas of silane ($SiH_4$), nitrogen ($N_2$), and ammonia ($NH_3$) as a supply gas is greater than or equal to 300 nm and less than or equal to 400 nm, the ESD resistance can be 300 V or higher. Therefore, when a stack in which a silicon nitride film which is deposited using a mixed gas of silane ($SiH_4$) and nitrogen ($N_2$) as a supply gas is stacked over the silicon nitride film which is deposited to a thickness greater than or equal to 300 nm and less than or equal to 400 nm using a mixed gas of silane ($SiH_4$), nitrogen ($N_2$), and ammonia ($NH_3$) is used as the nitride insulating film 433, a barrier film having a high ESD resistance can be achieved.

The stack of oxide semiconductor layers is formed of the three oxide semiconductor layers, in which the first oxide semiconductor layer S1, the second oxide semiconductor layer S2, and the third oxide semiconductor layer S3 are sequentially stacked. The three oxide semiconductor layers may be films having a crystalline structure or films having an amorphous structure.

Of the three oxide semiconductor layers, the first oxide semiconductor layer has the smallest thickness. The three oxide semiconductor layers each have a thickness greater than or equal to 5 nm and less than or equal to 40 nm.

For example, a 5-nm-thick In—Ga—Zn-based oxide film which is deposited using a sputtering target having an atomic ratio of In:Ga:Zn=1:3:2 may be used as the first oxide semiconductor layer S1, a 10-nm-thick In—Ga—Zn-based oxide film which is deposited using a sputtering target having an atomic ratio of In:Ga:Zn=3:1:2 may be used as the second oxide semiconductor layer S2, and a 10-nm-thick In—Ga—Zn-based oxide film which is deposited using a sputtering target having an atomic ratio of In:Ga:Zn=1:1:1 may be used as the third oxide semiconductor layer S3. In the case of forming these three layers, each layer is preferably deposited by a sputtering method in a mixed atmosphere containing more oxygen than a rare gas, preferably in an oxygen atmosphere (oxygen: 100%), and all of the resulting oxide semiconductor layers can also be referred to as I-type oxide semiconductor layers.

The deposition condition may be changed successively during the deposition of each oxide semiconductor layer, so that an energy band diagram shown in FIG. 1B may be obtained. Alternatively, the constituent elements of each oxide semiconductor layer may be diffused interactively by heat treatment or the like, so that an energy band diagram shown in FIG. 1B may be obtained. The energy band diagram in FIG. 1B is an energy band which corresponds to a portion between C and C' in FIG. 1A.

It is further preferable that a first gate insulating layer 402a in contact with the stack of oxide semiconductor layers include a region which contains oxygen in a proportion higher than that of oxygen in the stoichiometric composition (i.e., an oxygen-excess region). This is because, when the first gate insulating layer 402a in contact with the stack of oxide semiconductor layers includes an oxygen-excess region, oxygen can be supplied to the stack of oxide semiconductor layers, elimination of oxygen from the stack of oxide semiconductor layers can be prevented, and oxygen vacancies can be reduced. In order to provide the oxygen-excess region in the first gate insulating layer 402a, the first gate insulating layer 402a is formed in an oxygen atmosphere, for example. Alternatively, oxygen may be introduced into the formed first gate insulating layer 402a to provide the oxygen-excess region.

A second gate insulating layer 402b is preferably formed using a silicon nitride film which is deposited by a plasma CVD method in which a mixed gas of silane ($SiH_4$) and nitrogen ($N_2$) is supplied. This silicon nitride film functions as a barrier film, which has a function of preventing entry of hydrogen or a hydrogen compound into the oxide semiconductor layers so as to improve the reliability of the transistor 418.

Further, the gate insulating layer 402 does not have to be a stacked layer. For example, a 20-nm-thick silicon oxide film formed by a plasma CVD method may be used for the gate insulating layer 402. In this case, after the silicon oxide film is formed, radical oxidation treatment using microwave plasma for reducing oxygen vacancies is preferably performed. For the conditions of the treatment, for example, a high-density plasma apparatus is used, a power of 3800 W is supplied with a power supply of 2.45 GHz, the pressure is 106.67 Pa, the substrate temperature is 325° C., the flow rate of argon is 900 sccm, and the flow rate of oxygen is 5 sccm. Here, a high-density plasma apparatus refers to an apparatus which can realize a plasma density higher than or equal to $1 \times 10^{11}/cm^3$. For example, plasma is generated by applying a microwave power of 3 kW to 6 kW inclusive. By supplying the microwave power, the efficiency of decomposition of a source gas in the plasma is increased, so that oxygen radicals are increased, whereby the source gas is oxidized. Thus, the oxygen content in the gate insulating layer 402 is in excess of that in the stoichiometric composition. Thus, it is possible to form an oxide insulating film which contains oxygen at a higher proportion than the stoichiometric composition. Further, before the gate insulating layer 402 is formed, plasma treatment in which a high-density plasma apparatus is used and nitrous oxide ($N_2O$) and a rare gas are introduced may be performed. In the case where a single layer of silicon oxide is used as the gate insulating layer 402, the insulating layer 407 serves as a barrier film, so that reliability can be secured.

Embodiment 2

In this embodiment, one embodiment of a semiconductor device and one embodiment of a method for manufacturing the semiconductor device are described with reference to FIGS. 2A to 2D and FIGS. 3A and 3B. In this embodiment, an example of a method for manufacturing a transistor including an oxide semiconductor film is described.

First, a nitride insulating film 433 is formed over a substrate 400 having an insulating surface and a conductive film is formed thereover by a sputtering method, an evaporation method, or the like. The conductive film is etched so that a conductive layer 491 and wiring layers 434 and 436 are formed.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The nitride insulating film 433 can be formed using a single insulating film or a stack of insulating films selected from the following: a nitride insulating film of silicon nitride, aluminum nitride, or the like; an oxynitride insulating film of silicon oxynitride, aluminum oxynitride, or the like; or a nitride oxide insulating film of silicon nitride oxide or the like.

The conductive layer 491 and the wiring layers 434 and 436 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the conductive layer 491. The conductive layer 491 may have a single-layer structure or a stacked-layer structure.

The conductive layer 491 and the wiring layers 434 and 436 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the conductive layer 491 and the wiring layers 434 and 436 have a stacked structure of the above conductive material and the above metal material.

In order to obtain a normally-off switching element, it is preferable that the threshold voltage of the transistor be made positive by using a material having a work function of 5 eV (electron volts) or higher, preferably 5.5 eV or higher, for a gate electrode layer. Specifically, a material which includes an In—N bond and has a specific resistivity of $1 \times 10^{-1}$ Ω·cm to $1 \times 10^{-4}$ Ω·cm, preferably $5 \times 10^{-2}$ Ω·cm to $1 \times 10^{-4}$ Ω·cm, is used for the gate electrode layer. Examples of the material are an In—Ga—Zn-based oxide film containing nitrogen, an In—Sn—O film containing nitrogen, an In—Ga—O film containing nitrogen, an In—Zn—O film containing nitrogen, an In—O film containing nitrogen, and a metal nitride film (e.g., an InN film).

Next, an oxide insulating film is formed over the conductive layer 491 and the wiring layers 434 and 436. The oxide insulating film has a projecting portion reflecting the shape of the conductive layer 491 on its surface.

The oxide insulating film can be formed by a plasma CVD method, a sputtering method, or the like using any of silicon oxide, silicon oxynitride, aluminum oxide, aluminum oxynitride, hafnium oxide, gallium oxide, gallium oxide zinc, and zinc oxide, or a mixed material thereof. The oxide insulating film may have either a single-layer structure or a stacked-layer structure.

Then, polishing treatment (e.g., chemical mechanical polishing (CMP)) is performed, whereby an oxide insulating film 435 which is planarized is formed and top surfaces of the wiring layers 434 and 436 and a top surface of the conductive layer 491 are exposed. After the CMP treatment, cleaning is performed and heat treatment for removing moisture attached on the substrate is performed. A cross-sectional view of a structure obtained after this step corresponds to FIG. 2A.

After the planarization, an insulating film 437 and a stack 403 of oxide semiconductor layers are formed. A cross-sectional view of a structure obtained after this step corresponds to FIG. 2B.

Then, patterning is performed using one mask and the insulating film 437 and the stack 403 of oxide semiconductor layers are selectively etched. A cross-sectional view of a structure obtained after this step corresponds to FIG. 2C. It is preferable that the insulating film 437 and the stack 403 of oxide semiconductor layers be formed successively without being exposed to the air because interfaces of the films can be prevented from being contaminated by an impurity.

The insulating film 437 is formed by a plasma CVD method or a sputtering method. In the case where a plasma CVD method is used, it is particularly preferable to use a plasma CVD method (also referred to as a microwave plasma CVD method) in which plasma is generated utilizing electric-field energy of a microwave and a source gas for the gate insulating film is excited by the plasma, and the excited source gas is reacted on a surface of an object to deposit a reactant. The insulating film formed by a plasma CVD method using a microwave is a dense film, and therefore, the insulating film 437 obtained by processing the insulating film is also a dense film. The insulating film 437 has a thickness greater than or equal to 5 nm and less than or equal to 300 nm.

The insulating film 437 can be formed using a single layer or a stack of layers selected from the following films: an oxide insulating film of silicon oxide, gallium oxide, hafnium oxide, yttrium oxide, aluminum oxide, or the like; an oxynitride insulating film of silicon oxynitride, aluminum oxynitride, or the like; or a nitride oxide insulating film of silicon nitride oxide or the like.

Figure 2A:
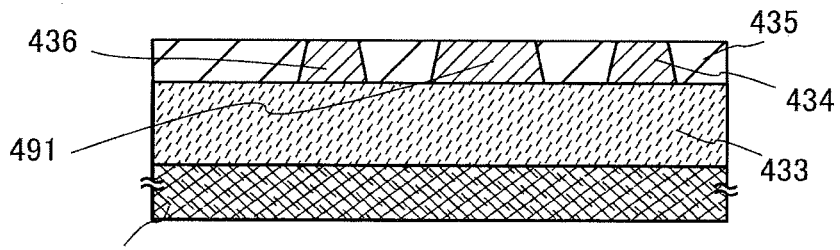
FIGS. 2A to 2D are cross-sectional views illustrating manufacturing steps of one embodiment of the present invention.
Figure 2B:
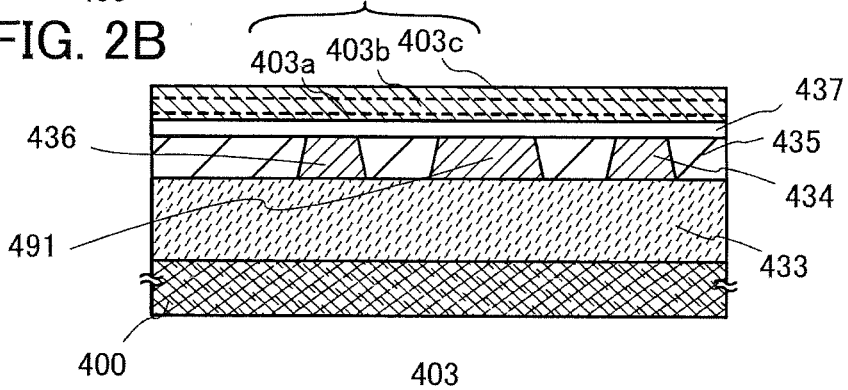
Figure 2C:
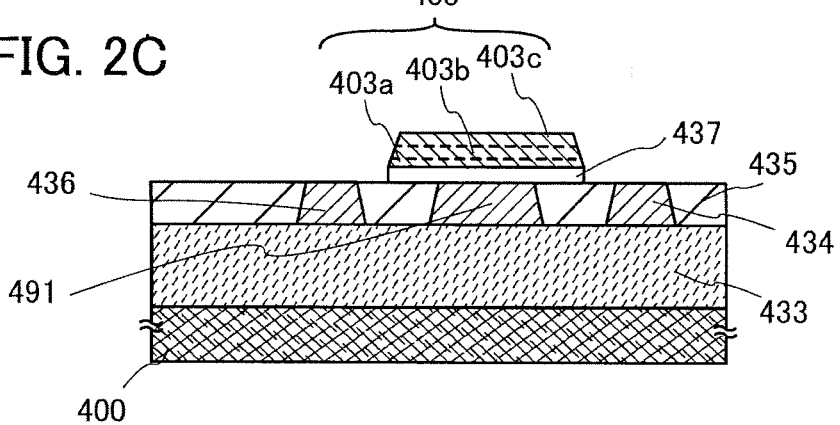

In this embodiment, the stack 403 of oxide semiconductor layers has a three-layer structure in which a first oxide semiconductor layer 403a, a second oxide semiconductor layer 403b, and a third oxide semiconductor layer 403c are stacked in this order, as illustrated in FIG. 2C.

In this embodiment, as the first oxide semiconductor layer 403a, an In—Ga—Zn-based oxide film which is deposited using a sputtering target having an atomic ratio of In:Ga:Zn=1:3:2 and has a thickness greater than or equal to 5 nm and less than or equal to 10 nm is used.

As the second oxide semiconductor layer 403b, an In—Ga—Zn-based oxide film is deposited to a thickness greater than or equal to 10 nm and less than or equal to 30 nm by a sputtering method using a sputtering target having an atomic ratio of In:Ga:Zn=3:1:2 in a mixed atmosphere containing oxygen and a rare gas or an oxygen atmosphere. Further, it is preferable that the second oxide semiconductor layer 403b be a CAAC-OS film.

As the third oxide semiconductor layer 403c, an In—Ga—Zn-based oxide semiconductor film is deposited to a thickness greater than or equal to 10 nm and less than or equal to 30 nm by a sputtering method using a sputtering target having an atomic ratio of In:Ga:Zn=1:1:1 in a mixed atmosphere containing oxygen and a rare gas or an oxygen atmosphere. Further, the third oxide semiconductor layer 403c may have an amorphous structure but is preferably a CAAC-OS film.

With such a stacked-layer structure, a structure in which the second oxide semiconductor layer 403b through which carriers flow is not in contact with the insulating film containing silicon is obtained.

When the insulating film 437 and the first oxide semiconductor layer 403a are deposited successively without being exposed to the air, impurity contamination of an interface between the insulating film 437 and the first oxide semiconductor layer 403a can be prevented. When the second oxide semiconductor layer 403b and the third oxide semiconductor layer 403c are deposited successively without being exposed to the air, impurity contamination of an interface between the second oxide semiconductor layer 403b and the third oxide semiconductor layer 403c can be prevented. The third oxide semiconductor layer 403c also functions as a protective film that protects the second oxide semiconductor layer 403b from exposure to the air in etching or the like in a later step.

In the case where the first oxide semiconductor layer 403a, the second oxide semiconductor layer 403b, and the third oxide semiconductor layer 403c are stacked successively without being exposed to the air, a multi-chamber deposition apparatus in which a plurality of sputtering apparatuses is provided may be used.

In order that the second oxide semiconductor layer 403b through which carriers flow is not in contact with the insulating film containing silicon, top and bottom interfaces of the second oxide semiconductor layer 403b are protected with the first oxide semiconductor layer 403a and third oxide semiconductor layer 403c so that an impurity such as silicon does not enter the second oxide semiconductor layer 403b and the interfaces thereof; accordingly, high field-effect mobility is achieved.

After the insulating film 437 and the stack 403 of oxide semiconductor layers are formed, a conductive film is formed. This conductive film is selectively etched, so that the electrode layers 445a and 445b and a conductive layer 442 are formed. A cross-sectional view of a structure obtained after this step corresponds to FIG. 2D. By performing etching plural times at this time, electrodes which have projecting regions in their bottom edge portions when seen in cross-section are formed. The electrode layers 445a and 445b having the projecting regions in the bottom edge portions function as a source electrode layer and a drain electrode layer of the transistor. The electrode layer 445a is provided on and in contact with the wiring layer 436 and the electrode layer 445b is provided on and in contact with the wiring layer 434.

A distance between the electrode layers 445a and 445b corresponds to a channel length L of the transistor. In order that the channel length L of the transistor is less than 50 nm, for example, approximately 20 nm, it is preferable that a resist be subjected to light exposure using an electron beam and the developed mask be preferably used as an etching mask of the conductive film. At a higher acceleration voltage, an electron beam can provide a finer pattern. The use of multiple electron beams can shorten the process time per substrate. In an electron beam writing apparatus capable of electron beam irradiation, the acceleration voltage is preferably in the range from 5 kV to 50 kV, for example. The current intensity is preferably in the range from $5 \times 10^{-12}$ A to $1 \times 10^{-11}$ A. The minimum beam size is preferably 2 nm or less. The minimum possible pattern line width is preferably 8 nm or less. Under the above conditions, a pattern with a width of, for example, 30 nm or less, preferably 20 nm or less, more preferably 8 nm or less, can be obtained.

The gate insulating layer 402 is provided over the electrode layers 445a and 445b and the conductive layer 442 and also provided over the stack 403 of oxide semiconductor layers. A material of the gate insulating layer 402 can be a silicon oxide film, a gallium oxide film, a gallium oxide zinc film, a $Ga_2O_3$ ($Gd_2O_3$) film, a zinc oxide film, an aluminum oxide film, a silicon nitride film, a silicon oxynitride film, an aluminum oxynitride film, or a silicon nitride oxide film.

Figure 2D:
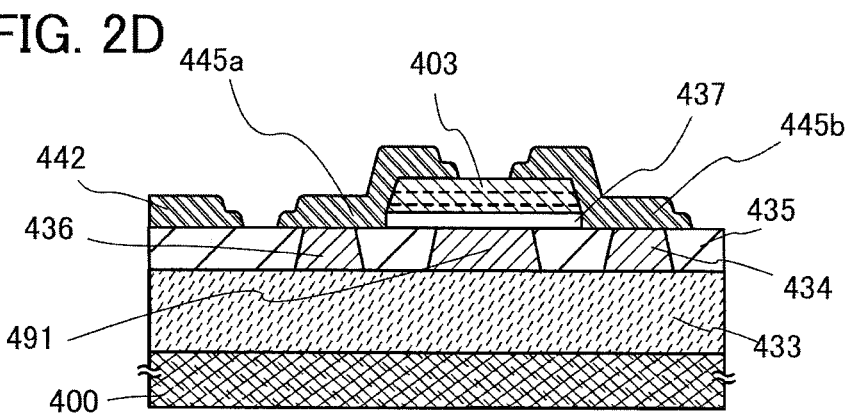

It is preferable that the gate insulating layer 402 include a region containing oxygen in a proportion higher than that of the stoichiometric composition (an oxygen-excess region). This is because, when an insulating layer in contact with the stack 403 of oxide semiconductor layers includes an oxygen-excess region, oxygen can be supplied to the stack 403 of oxide semiconductor layers, release of oxygen from the stack 403 of oxide semiconductor layers can be prevented, and oxygen vacancies can be reduced. In order to provide the oxygen-excess region in the gate insulating layer 402, the gate insulating layer 402 is formed in an oxygen atmosphere, for example. Alternatively, oxygen may be introduced into the deposited gate insulating layer 402 to provide the oxygen-excess region therein. Further, as illustrated in FIG. 2D, the gate insulating layer 402 preferably has a stacked-layer structure of a first gate insulating layer 402a and a second gate insulating layer 402b. The stacked-layer structure is formed in such a manner that, over an insulating film including a region containing excess oxygen (oxygen-excess region), a silicon oxide film or a silicon oxynitride film is formed on a condition where a high frequency power higher than or equal to 0.17 W/cm$^2$ and lower than or equal to 0.5 W/cm$^2$, preferably higher than or equal to 0.26 W/cm$^2$ and lower than or equal to 0.35 W/cm$^2$, is supplied. Specifically, the silicon oxynitride film is formed in conditions where silane (SiH$_4$) and dinitrogen monoxide (N$_2$O) are supplied as source gases at 160 sccm and 4000 sccm, respectively; the pressure of a treatment chamber is adjusted to 200 Pa; and a power of 1500 W is supplied with a high-frequency power supply of 27.12 MHz. Further, the substrate temperature at which the silicon oxynitride film is formed is set to 220° C.

Next, the gate insulating layer 402 is selectively etched to form an opening reaching the conductive layer 442. After that, a conductive film is formed and selectively etched, whereby an electrode layer 438 which is electrically connected to the conductive layer 442 is formed and a gate electrode layer 401 is formed over, the stack 403 of oxide semiconductor layers with the gate insulating layer 402 positioned therebetween. Then, an insulating layer 407 functioning as a barrier film is provided to cover the gate electrode layer 401 and the electrode layer 438.

As the insulating layer 407, it is preferable to use a silicon nitride film which is deposited by a plasma CVD method in which a mixed gas of silane (SiH$_4$) and nitrogen (N$_2$) is supplied. This silicon nitride film functions as a barrier film and prevents hydrogen or a hydrogen compound from entering an oxide semiconductor layer to be formed later, thereby improving the reliability of the semiconductor device.

The gate electrode layer 401 and the electrode layer 438 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 and the electrode layer 438 each have either a single-layer structure or a stacked-layer structure.

In this embodiment, a tungsten film is used as the gate electrode layer 401 on and in contact with the gate insulating layer 402.

Figure 3A:
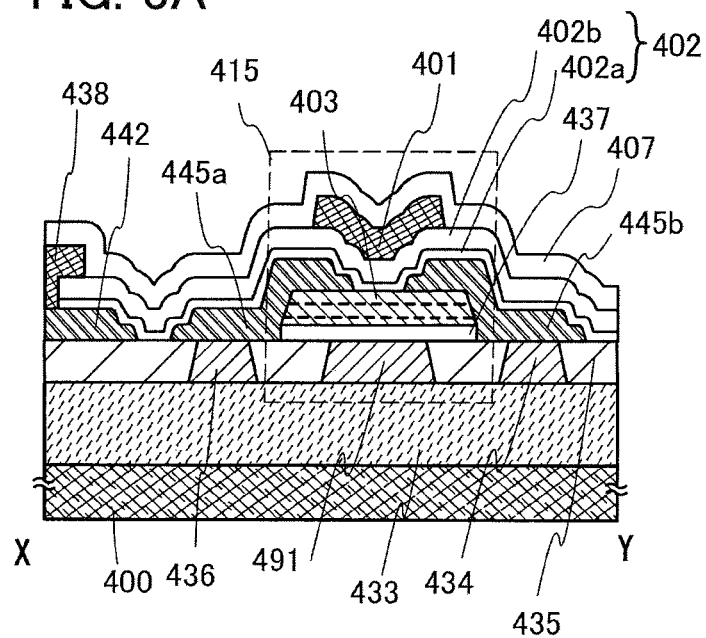
FIGS. 3A and 3B are a cross-sectional view and a top view illustrating one embodiment of the present invention.

Through the above process, a transistor 415 of this embodiment can be manufactured (see FIG. 3A). The transistor 415 is an example of a dual-gate transistor. FIG. 3A is a cross-sectional view of the transistor 415 in the channel length direction. In the dual-gate transistor 415, the insulating film 437 also serves as a gate insulating film.

The conductive layer 491 can function as a second gate electrode layer (also referred to as back gate) for controlling the electrical characteristics of the transistor 415. For example, by setting the potential of the conductive layer 491 to GND (or a fixed potential), the threshold voltage of the transistor 415 is increased, so that the transistor 415 can be normally off.

Figure 3B:
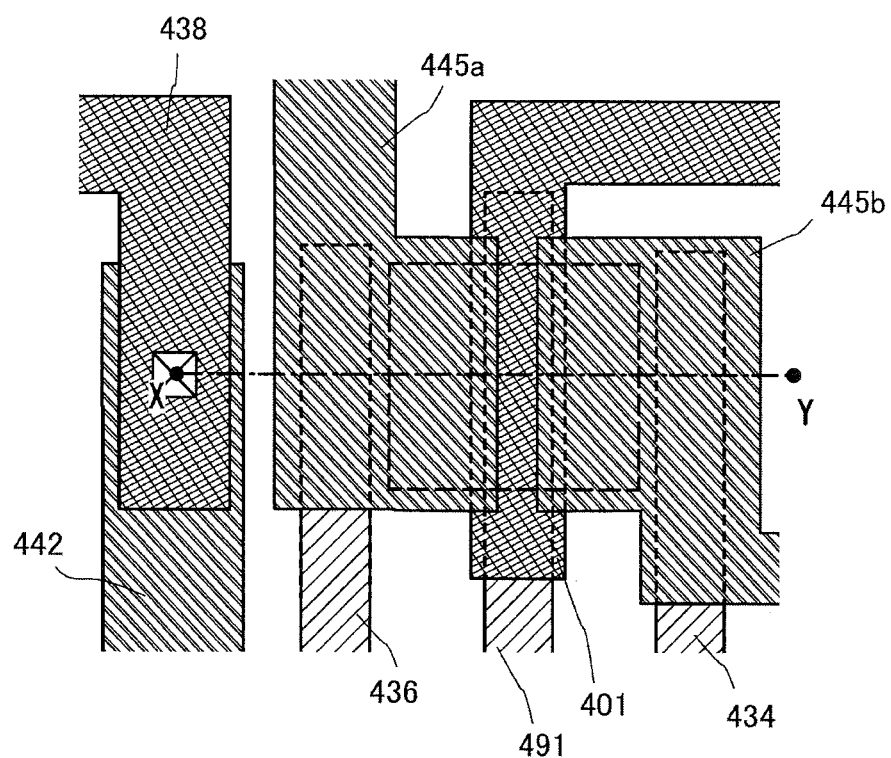

FIG. 3B is an example of a top view of the transistor 415. FIG. 3A is a cross section taken along a chain line X-Y in FIG. 3B.

This embodiment can be freely combined with Embodiment 1.

Embodiment 3

In this embodiment, a structural example in FIG. 4A which is partly different from the structure of FIG. 1A and a manufacturing method thereof are described below.

First, over the substrate 400, the oxide insulating film 435 is formed. The oxide insulating film 435 can be formed by a plasma CVD method, a sputtering method, or the like, using silicon oxide, silicon oxynitride, aluminum oxide, aluminum oxynitride, hafnium oxide, gallium oxide, gallium zinc oxide, zinc oxide, or a mixed material of any of these materials. The oxide insulating film may have either a single-layer structure or a stacked-layer structure. If needed, a nitride insulating film such as a silicon nitride film may be provided between the substrate 400 and the oxide insulating film 435.

Next, the first oxide semiconductor layer 403a and the second oxide semiconductor layer 403b are formed by patterning using the same mask, and then the third oxide semiconductor layer 403c is formed. In order to reduce oxygen vacancies in the second oxide semiconductor layer 403b, the third oxide semiconductor layer 403c may be formed after heat treatment in an oxygen atmosphere. The third oxide semiconductor layer 403c is formed using a different mask from the first and second oxide semiconductor layers 403a and 403b, so that the third oxide semiconductor layer 403c can cover the side surface of the first oxide semiconductor layer 403a and the side and top surfaces of the second oxide semiconductor layer 403b as illustrated in FIG. 4A.

Figure 4A:
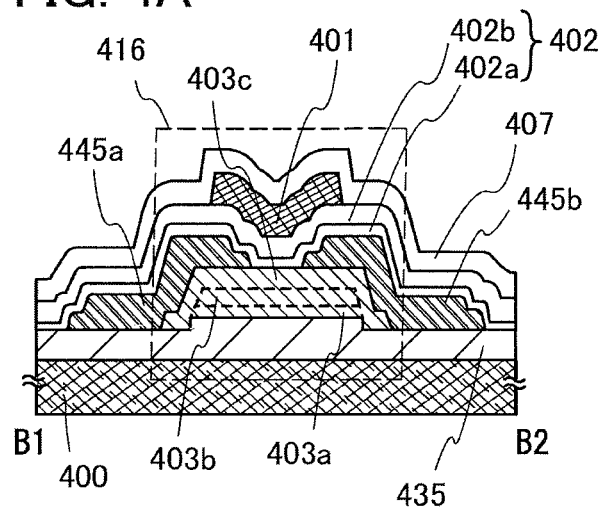
FIGS. 4A to 4C are cross-sectional views and a top view of one embodiment of the present invention.

During etching of the first and second oxide semiconductor layers 403a and 403b, the thickness of a region of the oxide insulating film 435 which is not covered with a mask becomes smaller as illustrated in FIG. 4A.

Subsequently, a conductive film is formed. This conductive film is selectively etched, so that the electrode layers 445a and 445b are formed.

Figure 4B:
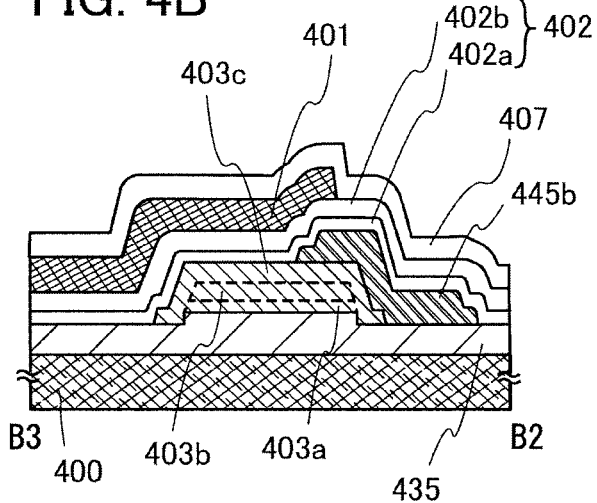

Then, the gate insulating layer 402 is provided over the electrode layers 445a and 445b, and is also provided over the third oxide semiconductor layer 403c. As illustrated in FIG. 4B, since the side surface of the second oxide semiconductor layer 403b is covered with the third oxide semiconductor layer 403c, the side surface of the second oxide semiconductor layer 403b is not in contact with the gate insulating layer 402.

Next, a conductive film is formed over the gate insulating layer 402 and selectively etched to form the gate electrode layer 401 over the third oxide semiconductor layer 403c with the gate insulating layer 402 positioned therebetween. The insulating layer 407 functioning as a barrier film is provided so as to cover the gate electrode layer 401.

Figure 4C:
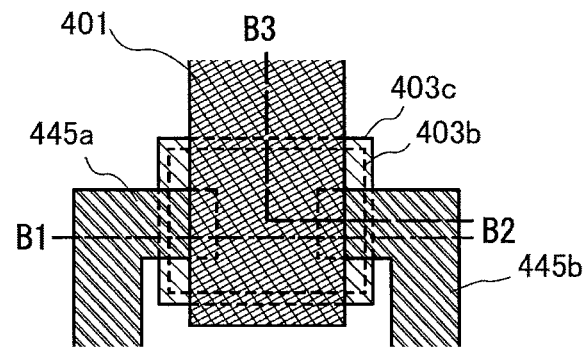

Through the above process, a transistor 416 illustrated in FIG. 4A can be manufactured. FIG. 4C is a top view. A cross section taken along a chain line B1-B2 in FIG. 4C corresponds to FIG. 4A and a cross section taken along a dotted line B2-B3 in FIG. 4C corresponds to FIG. 4B. As illustrated in FIG. 4C, the periphery of the third oxide semiconductor layer 403c is positioned outside the periphery of the second oxide semiconductor layer 403b.

This embodiment can be freely combined with Embodiment 1. Portions denoted by the same reference numerals as those of the drawings used in Embodiment 1 can be formed using the same material as those of Embodiment 1. Instead of the stack 403 of oxide semiconductor layers described in Embodiment 1, a structure in which the third oxide semiconductor layer 403c covers the side surface of the first oxide semiconductor layer 403a and the side and top surfaces of the second oxide semiconductor layer 403b may be employed. Since the third oxide semiconductor layer 403c can be provided between the second oxide semiconductor layer 403b and the electrode layer 445a, leakage current can be reduced.

Embodiment 4

In this embodiment, an example of a semiconductor device including the transistor described in Embodiment 2 is described with reference to FIGS. 5A and 5B.

Figure 5A:
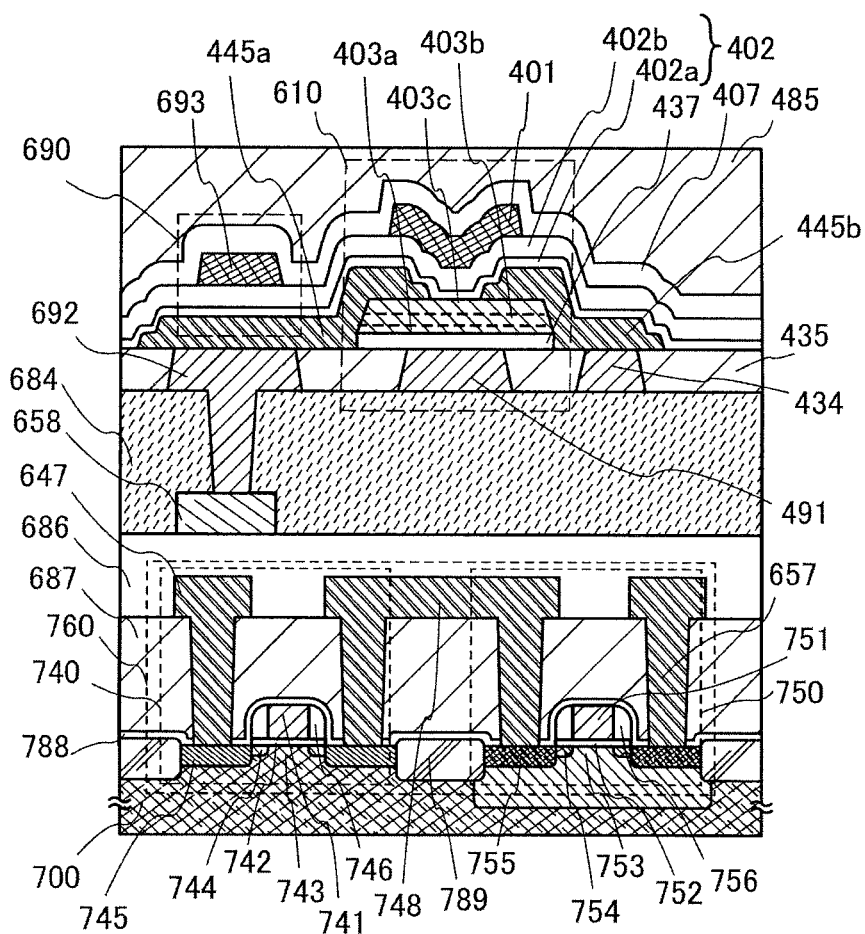
FIGS. 5A and 5B are a cross-sectional view and a circuit diagram illustrating one embodiment of the present invention.
Figure 5B:
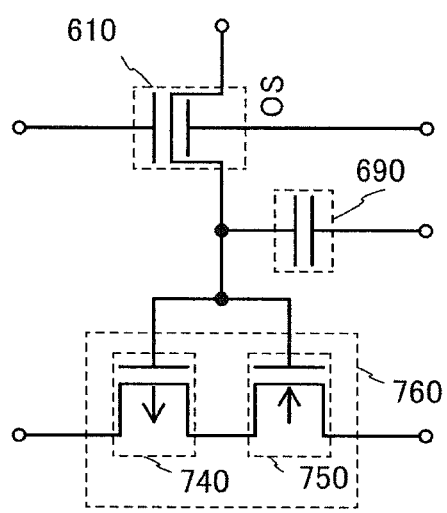

The semiconductor device illustrated in FIGS. 5A and 5B includes transistors 740 and 750 including a first semiconductor material in a lower portion, and a transistor 610 including a second semiconductor material in an upper portion. The transistor 610 has a similar structure to the transistor 415 described in Embodiment 2. The same reference numerals are used for the same parts as those in FIGS. 3A and 3B. FIG. 5B is a circuit diagram of the semiconductor device in FIG. 5A.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material such as silicon can operate at high speed easily. On the other hand, a transistor including an oxide semiconductor enables charge to be held for a long time owing to its characteristics.

As a substrate used in the semiconductor device, a single crystal semiconductor substrate or a polycrystalline semiconductor substrate made of silicon or silicon carbide, a compound semiconductor substrate made of silicon germanium or the like, a silicon on insulator (SOI) substrate, or the like can be used. A channel formation region of the transistor can be formed in or over the semiconductor substrate. The semiconductor device in FIG. 5A is an example in which the channel formation region is formed in the semiconductor substrate to form a lower transistor.

In the semiconductor device in FIG. 5A, a single crystal silicon substrate is used as a substrate 700, the transistors 740 and 750 are formed using the single crystal silicon substrate, and single crystal silicon is used as the first semiconductor material. The transistor 740 is an re-channel transistor and the transistor 750 is a p-channel transistor. The transistor 740 and the transistor 750 which are electrically connected to each other form a complementary metal oxide semiconductor (CMOS) circuit 760.

In this embodiment, the single crystal silicon substrate imparting p-type conductivity is used as the substrate 700; thus, an n-well is formed by adding an impurity element imparting n-type conductivity to a region in which the p-channel transistor 750 is to be formed. A channel formation region 753 of the transistor 750 is formed in the n-well. As the impurity element imparting n-type conductivity, phosphorus (P), arsenic (As), or the like can be used.

Therefore, an impurity element imparting p-type conductivity is not added to a formation region of the transistor 740 that is the n-channel transistor; however, a p-well may be formed by adding an impurity element imparting p-type conductivity. As the impurity element imparting p-type conductivity, boron (B), aluminum (Al), gallium (Ga), or the like can be used.

Meanwhile, when a single-crystal silicon substrate imparting n-type conductivity is used, an impurity element imparting p-type conductivity may be added to form a p-well.

The transistor 740 includes a channel formation region 743, an n-type impurity region 744 functioning as a lightly doped drain (LDD) region or an extension region, an n-type impurity region 745 functioning as a source region or a drain region, a gate insulating film 742, and a gate electrode layer 741. The n-type impurity region 745 has a higher impurity concentration than the n-type impurity region 744. The side surface of the gate electrode layer 741 is provided with a sidewall insulating layer 746. With the use of the gate electrode layer 741 and the sidewall insulating layer 746 as masks, the n-type impurity region 744 and the n-type impurity region 745 which have different impurity concentrations can be formed in a self-aligned manner.

The transistor 750 includes the channel formation region 753, a p-type impurity region 754 functioning as a lightly doped drain (LDD) region or an extension region, a p-type impurity region 755 functioning as a source region or a drain region, a gate insulating film 752, and a gate electrode layer 751. The p-type impurity region 755 has a higher impurity concentration than the p-type impurity region 754. The side surface of the gate electrode layer 751 is provided with a sidewall insulating layer 756. With the use of the gate electrode layer 751 and the sidewall insulating layer 756 as masks, the p-type impurity region 754 and the p-type impurity region 755 which have different impurity concentrations can be formed in a self-aligned manner.

In the substrate 700, the transistor 740 and the transistor 750 are isolated from each other by an element isolation region 789. An insulating film 788 and an insulating film 687 are stacked over the transistor 740 and the transistor 750. A wiring layer 647 in contact with the n-type impurity region 745 through an opening in the insulating film 788 and the insulating film 687 and a wiring layer 657 in contact with the p-type impurity region 755 through an opening in the insulating film 788 and the insulating film 687 are provided over the insulating film 687. A wiring layer 748 is provided over the insulating film 687 so as to electrically connect the transistor 740 and the transistor 750. The wiring layer 748 is electrically connected to the n-type impurity region 745 through an opening in the insulating film 788 and the insulating film 687 and reaching the n-type impurity region 745. Further, the wiring layer 748 is electrically connected to the p-type impurity region 755 through an opening in the insulating film 788 and the insulating film 687 and reaching the p-type impurity region 755.

An insulating film 686 is provided over the insulating film 687, the wiring layer 647, the wiring layer 748, and the wiring layer 657. A wiring layer 658 is formed over the insulating film 686. The wiring layer 658 is electrically connected to a gate wiring through an opening in the insulating films 788, 687, and 686. The gate wiring is formed over the gate insulating film 742 and the gate insulating film 752. The gate wiring branches into the gate electrode layer 741 and the gate electrode layer 751.

The semiconductor device of this embodiment is not limited to the structure in FIG. 5A. As the transistors 740 and 750, a transistor containing silicide (salicide) or a transistor which does not include a sidewall insulating layer may be used. When a structure that contains silicide (salicide) is used, the resistance of the source region and the drain region can be further lowered and the operation speed of the semiconductor device is increased. Further, the semiconductor device can be operated at low voltage, so that power consumption of the semiconductor device can be reduced.

Next, the structures of upper elements provided over the lower transistor in the semiconductor device in FIGS. 5A and 5B are described.

An insulating film 684 is stacked over the insulating film 686 and the wiring layer 658. The conductive layer 491 and a wiring layer 692 are formed over the insulating film 684.

The oxide insulating film 435 is provided over the conductive layer 491 and the wiring layer 692. The insulating film 437 is provided over the oxide insulating film 435. The first oxide semiconductor layer 403a is provided over the insulating film 437. The second oxide semiconductor layer 403b and the third oxide semiconductor layer 403c which each have a different composition from the first oxide semiconductor layer 403a are provided over the first oxide semiconductor layer 403a. Further, the electrode layers 445a and 445b which have projecting regions in the bottom edge portions are provided over the third oxide semiconductor layer 403c. The gate insulating layer 402 is provided on and in contact with a region of the second oxide semiconductor layer 403b which does not overlap with the electrode layer 445a or the electrode layer 445b (the channel formation region), and the gate electrode layer 401 is provided thereover.

A capacitor 690 is provided over the same oxide insulating film 435 as the transistor 610 without an increase in the number of steps. In the capacitor 690, the electrode layer 445a serves as one electrode, a capacitor electrode layer 693 serves as the other electrode, and the gate insulating layer 402 provided therebetween serves as a dielectric. The capacitor electrode layer 693 is formed in the same step as the gate electrode layer 401.

By setting the potential of the conductive layer 491 to GND (or a fixed potential), the conductive layer 491 serves as a back gate which controls the electrical characteristics of the transistor 610. The conductive layer 491 has a function of preventing static electricity. In the case where the threshold voltage of the transistor 610 is not required to be controlled by the conductive layer 491 in order to make the transistor 610 be a normally-off transistor, the conductive layer 491 is not necessarily provided. In the case where the transistor 610 is used for part of a particular circuit and a problem might be caused by providing the conductive layer 491, the conductive layer 491 is not necessarily provided in the circuit.

The wiring layer 692 is electrically connected to the wiring layer 658 through an opening in the insulating film 684. In the example in this embodiment, the insulating film 684 is subjected to planarization treatment using a CMP method.

In the semiconductor device, the insulating film 684 is provided between the lower portion and the upper portion, and functions as a barrier film to prevent impurities such as hydrogen, which cause deterioration or a change in electrical characteristics of the transistor 610 in the upper portion, from entering the upper portion from the lower portion. Thus, a fine inorganic insulating film (e.g., an aluminum oxide film or a silicon nitride film) having a good property of blocking impurities or the like is preferably used as the insulating film 684. The insulating film 684 can be formed by using the same material as the nitride insulating film 433 described in Embodiment 1.

In the case of using the same manufacturing method as that described in Embodiment 2, the transistor 610 can be manufactured similarly to the transistor 415. After that insulating layer 407 is formed, an interlayer insulating film 485 is formed. Further, a semiconductor device having a multilayer structure in which an embedded wiring is formed in the interlayer insulating film 485 and another semiconductor element, another wiring, or the like is formed above the embedded wiring may be manufactured.

This embodiment can be freely combined with Embodiment 1, 2, or 3.

Embodiment 5

Figure 6A:
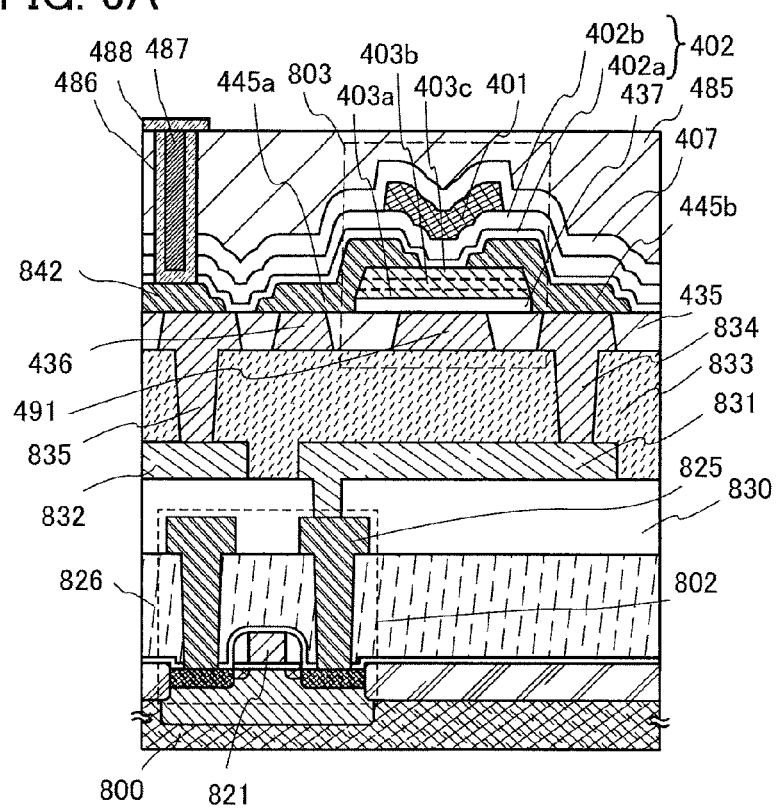
FIGS. 6A to 6C are a cross-sectional view and circuit diagrams illustrating one embodiment of the present invention.
Figure 6B:
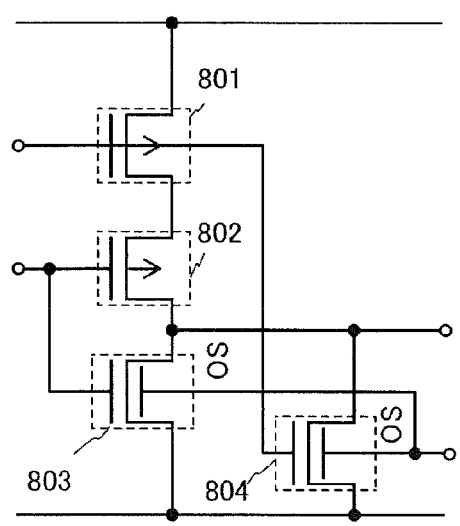
Figure 6C:
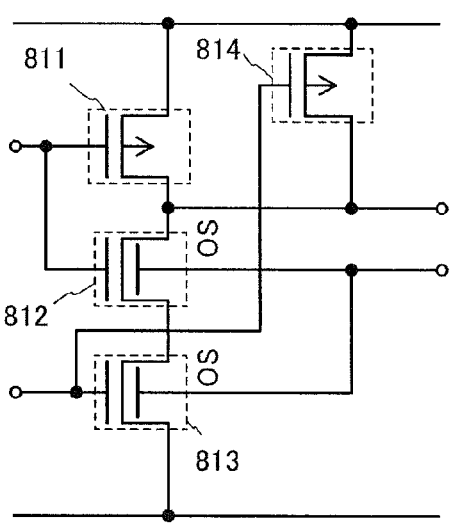

As another example of a semiconductor device including the transistor described in Embodiment 2, a cross-sectional view of a NOR circuit, which is a logic circuit, is illustrated in FIG. 6A. FIG. 6B is a circuit diagram of the NOR circuit in FIG. 6A, and FIG. 6C is a circuit diagram of a NAND circuit.

In the NOR circuit illustrated in FIGS. 6A and 6B, p-channel transistors 801 and 802 each have a structure similar to that of the transistor 750 in FIGS. 5A and 5B in that a single crystal silicon substrate is used for a channel formation region, and n-channel transistors 803 and 804 each have a structure similar to that of the transistor 610 in FIGS. 5A and 5B and that of the transistor 415 in Embodiment 2 in that an oxide semiconductor film is used for a channel formation region.

In the NOR circuit illustrated in FIGS. 6A and 6B, a conductive layer 491 for controlling electrical characteristics of the transistors is provided to overlap with gate electrode layers with oxide semiconductor films provided therebetween in the transistors 803 and 804. By controlling the potential of the conductive layer to GND, for example, the threshold voltages of the transistors 803 and 804 are increased, so that the transistors can be normally off. In the NOR circuit in this embodiment, conductive layers which are provided in the transistors 803 and 804 and can function as back gates are electrically connected to each other. However, the present invention is not limited to the structure, and the conductive layers functioning as back gates may be electrically controlled independently.

In the semiconductor device illustrated in FIG. 6A, a single crystal silicon substrate is used as a substrate 800, the transistor 802 is formed using the single crystal silicon substrate, and the transistor 803 in which a stack of oxide semiconductor layers is used for a channel formation region is formed over the transistor 802.

The gate electrode layer 401 of the transistor 803 is electrically connected to a wiring layer 832. The wiring layer 832 is electrically connected to a wiring layer 835. The gate electrode layer 401 of the transistor 803 is electrically connected to an embedded wiring, and the embedded wiring is electrically connected to an electrode layer 842. Note that the embedded wiring includes a first barrier metal film 486, a second barrier metal film 488, and a low-resistance conductive layer 487 surrounded by the first barrier metal film 486 and the second barrier metal film 488.

The embedded wiring is formed in such a manner that a contact hole reaching the electrode layer 842 is formed in the interlayer insulating film 485, the first barrier metal film 486 is formed, and a copper film or a copper alloy film is formed thereover so as to form the low-resistance conductive layer 487. Then, polishing is performed for planarization, and the second barrier metal film 488 is formed so as to protect the exposed low-resistance conductive layer 487. The embedded wiring includes the first barrier metal film 486, the second barrier metal film 488, and the low-resistance conductive layer 487 surrounded by the first barrier metal film 486 and the second barrier metal film 488.

Each of the first barrier metal film 486 and the second barrier metal film 488 may be formed using a conductive material which suppresses diffusion of copper contained in the low-resistance conductive layer 487. Examples of the conductive material are a tantalum nitride film, a molybdenum nitride film, and a tungsten nitride film.

The wiring layer 832 is provided in an opening formed in an insulating film 826 and an insulating film 830. The wiring layer 835 is provided in an opening formed in an insulating film 833. The electrode layer 842 is formed over the wiring layer 835.

An electrode layer 825 of the transistor 802 is electrically connected the electrode layer 445*b* of the transistor 803 through wiring layers 831 and 834. The wiring layer 831 is formed in an opening in the insulating film 830, and the wiring layer 834 is formed in an opening in the insulating film 833. The electrode layer 445*a* and the electrode layer 445*b* function as source and drain electrode layers of the transistor 803.

The first oxide semiconductor layer 403*a* is formed on and in contact with the insulating film 437. The third oxide semiconductor layer 403*c* is formed on and in contact with the second oxide semiconductor layer 403*b*. With the insulating film 437 and the gate insulating layer 402, unnecessary release of oxygen can be suppressed, and the second oxide semiconductor layer 403*b* can be kept in an oxygen excess state. Thus, in the transistor 803, oxygen vacancies in the second oxide semiconductor layer 403*b* and at the interface thereof can be filled efficiently. The transistor 804 has a structure and an effect which are similar to those of the transistor 803.

In the NAND circuit in FIG. 6C, p-channel transistors 811 and 814 each have a structure similar to that of the transistor 750 in FIGS. 5A and 5B, and n-channel transistors 812 and 813 each have a structure similar to that of the transistor 610 in FIGS. 5A and 5B in that an oxide semiconductor film is used for a channel formation region.

In the NAND circuit illustrated in FIG. 6C, conductive layers controlling electrical characteristics of the transistors are provided to overlap with gate electrode layers with oxide semiconductor films provided therebetween in the transistors 812 and 813. By controlling the potential of the conductive layer to GND, for example, the threshold voltages of the transistors 812 and 813 are increased, so that the transistors can be normally off. In the NAND circuit in this embodiment, the conductive layers which are provided in the transistors 812 and 813 and function as back gates are electrically connected to each other. However, the present invention is not limited to the structure, and the conductive layers functioning as back gates may be electrically controlled independently.

By applying a transistor including an oxide semiconductor for a channel formation region and having extremely small off-state current to the semiconductor device in this embodiment, power consumption of the semiconductor device can be sufficiently reduced.

A semiconductor device which is miniaturized, is highly integrated, and has stable and excellent electrical characteristics by stacking semiconductor elements including different semiconductor materials and a method for manufacturing the semiconductor device can be provided.

The NOR circuit and the NAND circuit including the transistors described in Embodiment 2 are described as examples in this embodiment; however, the present invention is not limited to the circuits, and an AND circuit, an OR circuit, or the like can be formed using the transistors described in Embodiment 2 or 3. For example, a semiconductor device (storage device) in which stored data can be held even when power is not supplied and which has an unlimited number of times of writing with the transistors described in Embodiment 2 or 3 can be manufactured.

Figure 7:
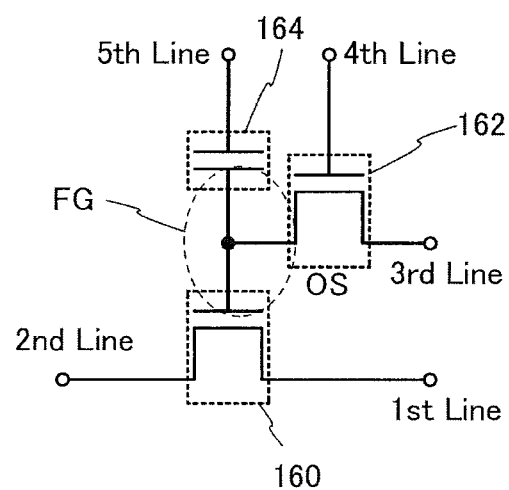
FIG. 7 is a circuit diagram illustrating one embodiment of the present invention.

FIG. 7 is an example of a circuit diagram of a semiconductor device.

In FIG. 7, a first wiring (a 1st line) is electrically connected to a source electrode layer of a transistor 160. A second wiring (2nd line) is electrically connected to a drain electrode layer of the transistor 160. Any of the transistors 740, 750, and 802 described in this embodiment can be used as the transistor 160.

A third wiring (3rd line) is electrically connected to one of a source electrode layer and a drain electrode layer of a transistor 162, and a fourth wiring (4th line) is electrically connected to a gate electrode layer of the transistor 162. A gate electrode layer of the transistor 160 and the other of the source electrode and the drain electrode of the transistor 162 are electrically connected to one electrode of a capacitor 164. A fifth wiring (5th line) and the other electrode of the capacitor 164 are electrically connected to each other.

For the transistor 162, any of the structures of the transistors 415 and 416 described in Embodiment 2 or 3 can be used.

The semiconductor device having the circuit configuration in FIG. 7 utilizes a characteristic in which the potential of the gate electrode layer of the transistor 160 can be held, and thus enables data writing, holding, and reading as follows.

Writing and holding of data are described. First, the potential of the fourth wiring is set to a potential at which the transistor 162 is turned on, so that the transistor 162 is turned on. Accordingly, the potential of the third wiring is supplied to the gate electrode layer of the transistor 160 and to the capacitor 164. That is, predetermined charge is supplied to the gate electrode layer of the transistor 160 (writing). Here, charge for supply of a potential level or charge for supply of a different potential level (hereinafter referred to as a low-level charge and a high-level charge) is given. After that, the potential of the fourth wiring is set to a potential at which the transistor 162 is turned off, so that the transistor 162 is turned off. Thus, the charge given to the gate electrode layer of the transistor 160 is held (holding).

Since the off-state current of the transistor 162 is extremely small, the charge of the gate electrode layer of the transistor 160 is held for a long time.

Next, reading of data is described. By supplying an appropriate potential (a reading potential) to the fifth wiring while a predetermined potential (a constant potential) is supplied to the first wiring, the potential of the second wiring varies depending on the amount of charge held in the gate electrode layer of the transistor 160. This is because in general, when the transistor 160 is an n-channel transistor, an apparent threshold voltage $V_{th\_H}$ in the case where the high-level charge is given to the gate electrode layer of the transistor 160 is lower than an apparent threshold voltage $V_{th\_L}$ in the case where the low-level charge is given to the gate electrode layer of the transistor 160. Here, an apparent threshold voltage refers to the potential of the fifth wiring, which is needed to turn on the transistor 160. Thus, the potential of the fifth wiring is set to a potential $V_0$ which is between $V_{th\_H}$ and $V_{th\_L}$, whereby charge given to the gate electrode layer of the transistor 160 can be determined. For example, in the case where the high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the stored data can be read by the potential of the second wiring.

Note that in the case where memory cells are arrayed to be used, only data of desired memory cells needs to be read. In the case where such reading is not performed, a potential at which the transistor 160 is turned off regardless of the state of the gate electrode layer of the transistor 160, that is, a potential smaller than $V_{th\_H}$ may be given to the fifth wiring. Alternatively, a potential at which the transistor 160 is turned on regardless of the state of the gate electrode layer, that is, a potential higher than $V_{th\_L}$ may be given to the fifth wiring.

FIG. 8 illustrates another example of one embodiment of the structure of the storage device.

FIG. 8 is a perspective view of a storage device. The storage device illustrated in FIG. 8 includes a plurality of layers of memory cell arrays (memory cell arrays 3400(1) to 3400(n)) (n is an integer greater than or equal to 2)) each including a plurality of memory cells as memory circuits in the upper portion, and a logic circuit 3004 in the lower portion which is necessary for operating the memory cell arrays 3400(1) to 3400(n).

FIG. 8 illustrates the logic circuit 3004, the memory cell array 3400(1), and the memory cell array 3400(2), in which a memory cell 3170a and a memory cell 3170b are illustrated as typical examples among the plurality of memory cells included in the memory cell array 3400(1) and the memory cell array 3400(2). The memory cell 3170a and the memory cell 3170b can have a configuration similar to the circuit configuration described in this embodiment with reference to FIG. 7, for example.

A transistor in which a channel formation region is formed in an oxide semiconductor film is used as each transistor included in the memory cells 3170a and 3170b. The structure of the transistor in which the channel formation region is formed in the oxide semiconductor film is the same as the structure described in Embodiment 2; thus, the description of the structure is omitted.

The logic circuit 3004 includes a transistor in which a semiconductor material other than an oxide semiconductor is used as a channel formation region. For example, the transistor can be a transistor obtained in such a manner that an element isolation insulating layer is provided on a substrate including a semiconductor material (e.g., silicon) and a region serving as the channel formation region is formed in a region surrounded by the element isolation insulating layer. Note that the transistor may be a transistor obtained in such a manner that the channel formation region is formed in a semiconductor film such as a polycrystalline silicon film formed on an insulating surface or in a silicon film of an SOI substrate.

The memory cell arrays 3400(1) to 3400(n) and the logic circuit 3004 are stacked with interlayer insulating layers provided therebetween, and electrical connection or the like may be established as appropriate by an electrode or a wiring penetrating the interlayer insulating layers.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device according to one embodiment of the present invention does not have a limit on the number of times of writing which is a problem in a conventional nonvolatile memory, and reliability thereof is drastically improved. Furthermore, data is written depending on the on state and the of state of the transistor, whereby high-speed operation can be easily realized.

As described above, a miniaturized and highly-integrated semiconductor device having high electrical characteristics and a method for manufacturing the semiconductor device can be provided.

This embodiment can be freely combined with any of Embodiments 1, 2, 3 and 4.

Embodiment 6

In this embodiment, a central processing unit (CPU) in which at least one of the transistors 415 and 416 described in Embodiment 2 or 3 is provided in part of the CPU is described as an example of a semiconductor device.

Figure 9A:
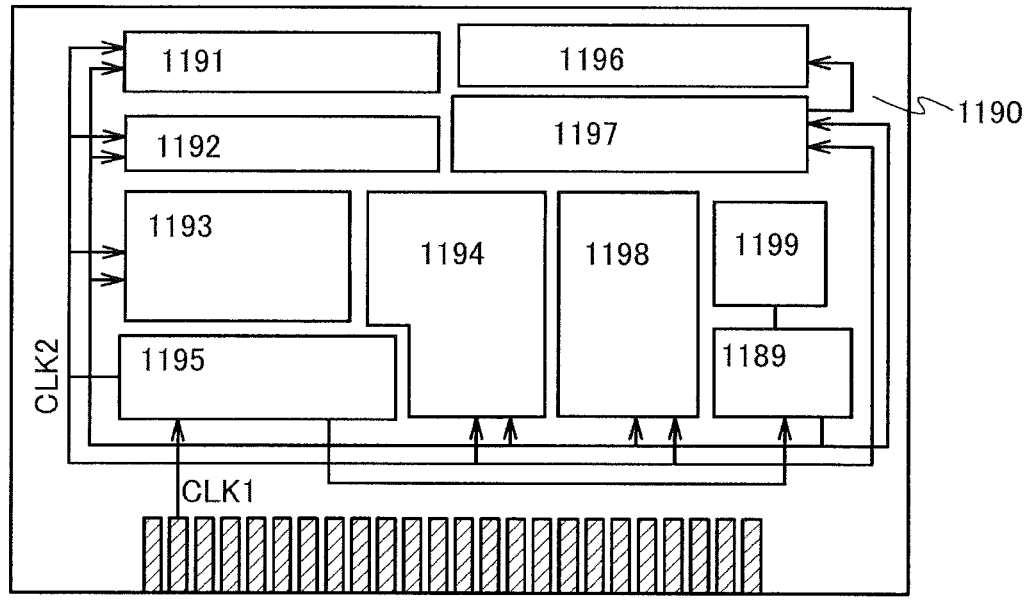
FIGS. 9A to 9C are circuit diagrams of one embodiment of the present invention.

FIG. 9A is a block diagram illustrating a specific structure of a CPU. The CPU illustrated in FIG. 9A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 9A is only an example in which the structure is simplified, and a variety of structures is applied to an actual CPU depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 9A, a memory cell is provided in the register 1196. As the memory cell of the register 1196, the memory cell described in Embodiment 5 can be used.

In the CPU illustrated in FIG. 9A, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 9B:
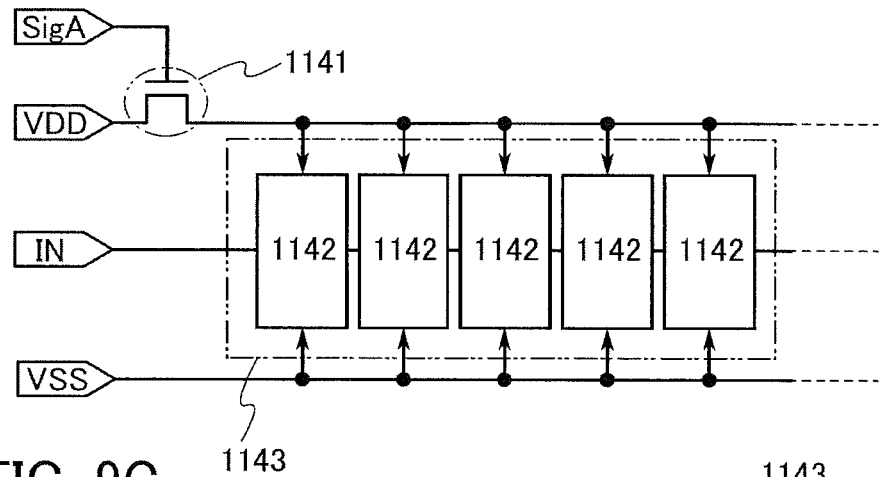
Figure 9C:
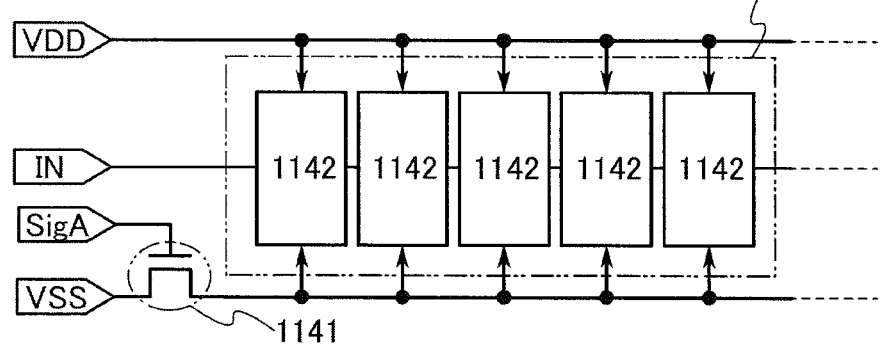

The power supply can be stopped by a switching element provided between a memory cell group and a node to which a power supply potential VDD or a power supply potential VSS is supplied, as illustrated in FIG. 9B or FIG. 9C. Circuits illustrated in FIGS. 9B and 9C are described below.

FIGS. 9B and 9C each illustrate an example of a memory circuit in which one of the transistors 415, and 416, and 418 described in Embodiment 1, 2, or 3 is used as a switching element for controlling supply of power supply potential to memory cells.

The storage device illustrated in FIG. 9B includes a switching element 1141 and a memory cell group 1143 including a plurality of memory cells 1142. Specifically, as each of the memory cells 1142, the memory cell described in Embodiment 3 can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 9B, any of the transistors 415, 416, and 418 described in Embodiment 1, 2, or 3 is used as the switching element 1141, and the switching of the transistor is controlled by a signal SigA supplied to a gate electrode layer thereof.

Note that FIG. 9B illustrates a configuration in which the switching element 1141 includes only one transistor; however, one embodiment of the present invention is not limited thereto and the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 9B, the switching element 1141 may control the supply of the low-level power supply potential VSS.

FIG. 9C illustrates an example of a storage device in which each of the memory cells 1142 included in the memory cell group 1143 is supplied with the low-level power supply potential VSS through the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example in this embodiment, the transistor can also be applied to an LSI such as a digital signal processor (DSP), a custom LSI, or a field programmable gate array (FPGA).

The structures and methods described in this embodiment can be combined as appropriate with any of the structures and methods described in the other embodiments.

Embodiment 7

In this embodiment, a display device including a bottom-gate transistor is described as an example. The bottom-gate transistor can be formed by a method partly different from the method for forming the transistor described in Embodiment 2; for example, an oxide insulating film is formed after a gate electrode layer is formed, the stack of oxide semiconductor layers is formed without CMP treatment, and a source electrode layer and a drain electrode layer are formed thereover. After the source electrode layer and the drain electrode layer are formed, wet etching using dilute hydrofluoric acid is performed so that part of the stack of oxide semiconductor layers is thinned; thus, a channel-etched transistor 310 illustrated in FIG. 10B can be formed.

Figure 10A:
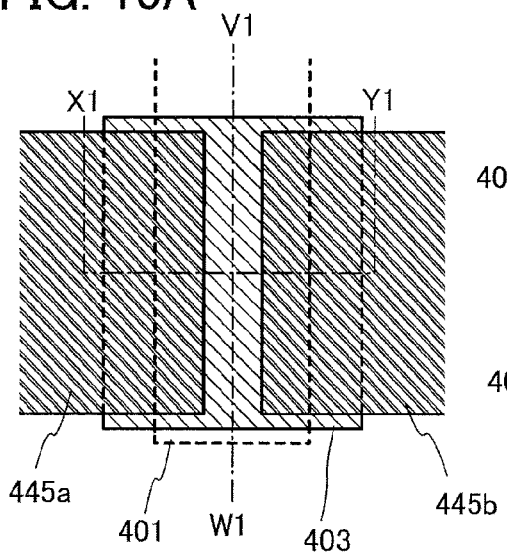
FIGS. 10A to 10C are a top view and cross-sectional views illustrating one embodiment of the present invention.
Figure 10C:
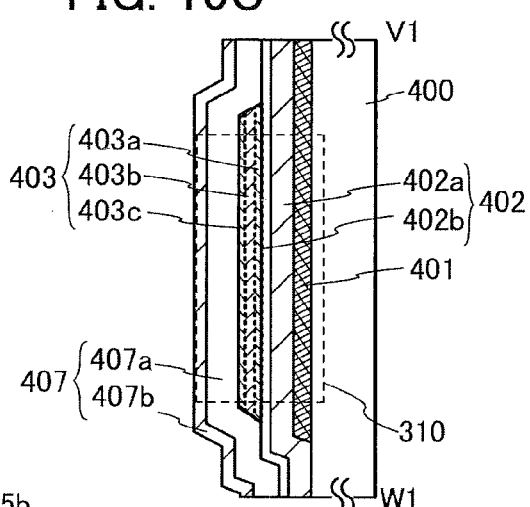
Figure 10B:
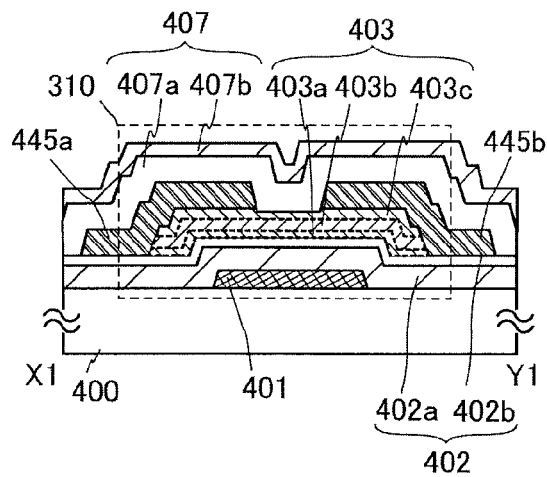

FIGS. 10A to 10C illustrate a structural example of the transistor 310. FIG. 10A is a plan view of the transistor 310, FIG. 10B is a cross-sectional view taken along the line X1-Y1 in FIG. 10A, and FIG. 10C is a cross-sectional view taken along the line V1-W1 in FIG. 10A.

The transistor 310 in FIGS. 10A to 10C includes a gate electrode layer 401 provided over a substrate 400 having an insulating surface, a gate insulating layer 402 over the gate electrode layer 401, a stack 403 of oxide semiconductor layers which is in contact with the gate insulating layer 402 and overlaps with the gate electrode layer 401, and the electrode layer 445a and the electrode layer 445b which are electrically connected to the stack 403 of oxide semiconductor layers. Further, an insulating layer 407 which covers the electrode layer 445a and the electrode layer 445b and is in contact with the stack 403 of oxide semiconductor layers may be included as a component of the transistor 310. The channel length of the transistor 310 can be, for example, 1 μm or more.

In this embodiment, the gate insulating layer 402 is a stack of a gate insulating layer 402a which is in contact with the gate electrode layer 401 and a gate insulating layer 402b which is provided over the gate insulating layer 402a and is in contact with the stack 403 of oxide semiconductor layers. Further, the insulating layer 407 is a stack of an insulating layer 407a which is in contact with the electrode layer 445a and the electrode layer 445b and an insulating layer 407b which is over the insulating layer 407a.

Materials, compositions, crystal structures, and the like of the first oxide semiconductor layer 403a and the third oxide semiconductor layer 403c are selected as appropriate so that the first oxide semiconductor layer 403a and the third oxide semiconductor layer 403c have the energy band diagram shown in FIG. 1B. When the oxide semiconductor layers have the same constituent elements, the first oxide semiconductor layer 403a or the third oxide semiconductor layer 403c may be formed to have a composition having a higher band gap.

The first oxide semiconductor layer 403a prevents capture of carriers at the interface between the channel and the gate insulating layer, so that photodegradation (e.g., negative-bias temperature stress photodegradation) of the transistor can be reduced, which enables the transistor to have high reliability.

In general, an oxide semiconductor layer is mostly formed by a sputtering method. On the other hand, when the oxide semiconductor layer is formed by sputtering, in some cases, an ionized rare gas element (e.g., argon) or an element ejected from a surface of a sputtering target flicks off a constituent element of a film, such as a gate insulating layer, on which the oxide semiconductor layer is to be formed. The element flicked off from the film on which the oxide semiconductor layer is to be formed might enter the oxide semiconductor layer and function as an impurity element therein. In particular, a portion of the oxide semiconductor layer, which is in the vicinity of the surface on which the oxide semiconductor layer is formed, might have high concentration of the impurity element. Further, when the impurity element remains in the vicinity of the surface where the oxide semiconductor layer is to be formed, the resistance of the oxide semiconductor layer is increased, which causes the electrical characteristics of the transistor to be lowered.

However, in the transistor 310, since the first oxide semiconductor layer 403a is provided between the gate insulating layer 402 and the second oxide semiconductor layer 403b in which the channel is formed, a constituent element of the gate insulating layer 402 can be prevented from diffusing to the channel. That is, the first oxide semiconductor layer 403a may contain the constituent element (e.g., silicon) of the gate insulating layer 402 as an impurity. By including the first oxide semiconductor layer 403a, the transistor 310 can have more stabilized electrical characteristics; thus, a highly reliable semiconductor device can be provided.

The third oxide semiconductor layer 403c provided on the back-channel side of the second oxide semiconductor layer 403b reduces the influence of a trap level at the back-channel-side interface of the transistor 310. For example, the third oxide semiconductor layer 403c can prevent a constituent element of the electrode layers 445a and 445b from diffusing into the second oxide semiconductor layer 403b. That is, the third oxide semiconductor layer 403c might contain the constituent element (e.g., copper) of the electrode layers 445a and 445b, as an impurity. Since formation of a trap level in the channel of the transistor can be prevented when the third oxide semiconductor layer 403c is provided, an increase in S value due to the trap level and/or control of the threshold voltage can be performed. When the threshold voltage is controlled with the third oxide semiconductor layer 403c, the transistor can be made normally off.

An example of a method for manufacturing the transistor 310 is described below.

First, the gate electrode layer 401 (including a wiring formed with the same layer) is formed over the substrate 400 having an insulating surface.

Next, the gate insulating layer 402 is provided over the gate electrode layer 401 so as to cover the gate electrode layer 401. Note that it is preferable that a region which is included in the gate insulating layer 402 and is in contact with the first oxide semiconductor layer 403a formed later (in this embodiment, the gate insulating layer 402b) be formed using an oxide insulating layer and it is further preferable that the region include a region containing oxygen in a proportion higher than that of the stoichiometric composition (an oxygen-excess region). In this embodiment, a silicon nitride film is formed as the gate insulating layer 402a, and a silicon oxide film is formed as the gate insulating layer 402b.

The gate insulating layer 402 does not have to be a stacked layer. For example, a 20-nm-thick silicon oxide film formed by a plasma CVD method may be used for the gate insulating layer 402. In this case, after the silicon oxide film is formed, radical oxidation treatment using microwave plasma for reducing oxygen vacancies is preferably performed. For the conditions of the treatment, for example, a high-density plasma apparatus is used, a power of 3800 W is supplied with a power supply of 2.45 GHz, the pressure is 106.67 Pa, the substrate temperature is 325° C., the flow rate of argon is 900 sccm, and the flow rate of oxygen is 5 sccm. Here, a high-density plasma apparatus refers to an apparatus which can realize a plasma density higher than or equal to $1\times10^{11}/cm^3$. For example, plasma is generated by applying a microwave power of 3 kW to 6 kW inclusive. Further, before the gate insulating layer 402 is formed, plasma treatment in which nitrous oxide ($N_2O$) and a rare gas are introduced and a high-density plasma is used may be performed.

Next, the stack 403 of oxide semiconductor layers is formed over the gate insulating layer 402. The stack 403 of oxide semiconductor layers has a three-layer structure in which the first oxide semiconductor layer 403a, the second oxide semiconductor layer 403b, and the third oxide semiconductor layer 403c are stacked in this order. In this embodiment, the oxide semiconductor layer 403a is formed using a target having an atomic ratio of In:Ga:Zn=1:3:2. The second oxide semiconductor layer 403b is formed using a target having an atomic ratio of In:Ga:Zn=3:1:2. The third oxide semiconductor layer 403c is formed using a target having an atomic ratio of In:Ga:Zn=1:1:1.

Next, a conductive film is formed over the stack 403 of oxide semiconductor layers and processed to form the electrode layer 445a and the electrode layer 445b (including a wiring formed with the same layer). Then, wet etching using dilute hydrofluoric acid is performed so that part of the third oxide semiconductor layer 403c is thinned.

Next, the insulating layer 407 is formed to cover the electrode layer 445a, the electrode layer 445b, and the exposed stack 403 of oxide semiconductor layers. The insulating layer 407 can be formed using a single layer or a stack of layers of one or more of the following films formed by a plasma CVD method or a sputtering method: a silicon oxide film, a gallium oxide film, an aluminum oxide film, a silicon nitride film, a silicon oxynitride film, an aluminum oxynitride film, a silicon nitride oxide film, and the like. Note that it is preferable that an oxide insulating layer be formed as the insulating layer 407 (in this embodiment, the insulating layer 407a) in contact with the stack 403 of oxide semiconductor layers because the oxide insulating layer can supply oxygen to the stack 403 of oxide semiconductor layers.

After the formation of the oxide insulating layer in which oxygen is diffused, a silicon oxide film or a silicon oxynitride film may be formed under the following conditions: the substrate placed in a treatment chamber of the plasma CVD apparatus, which is vacuum-evacuated, without exposure to the air is held at a temperature higher than or equal to 180° C. and lower than or equal to 250° C., preferably higher than or equal to 180° C. and lower than or equal to 230° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 W/cm$^2$ and lower than or equal to 0.5 W/cm$^2$, preferably higher than or equal to 0.26 W/cm$^2$ and lower than or equal to 0.35 W/cm$^2$ is supplied to an electrode provided in the treatment chamber. Under the above conditions, the decomposition efficiency of the source gas in plasma is enhanced, oxygen radicals are increased, and oxidation of the source gas is promoted; thus, the oxygen content in the formed silicon oxide film or silicon oxynitride film is in excess of that in the stoichiometric composition. However, the bonding strength of silicon and oxygen is weak in the above substrate temperature range; therefore, part of oxygen is released by heating. Thus, it is possible to form an oxide insulating layer which contains oxygen in a proportion higher than that of oxygen in the stoichiometric composition and from which part of oxygen is released by heating.

In this embodiment, the silicon oxide film in which oxygen is diffused and the silicon oxide film from which part of oxygen is released by heating, which are described above, is formed as the insulating layer 407a, and a silicon nitride film is formed as the insulating layer 407b.

Heat treatment may be performed after the insulating layer 407 is formed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C.

Through the above steps, the transistor 310 of this embodiment can be formed.

In the transistor described in this embodiment, the second oxide semiconductor layer 403b which functions as a current path (channel) of the transistor is sandwiched between the first oxide semiconductor layer 403a and the third oxide semiconductor layer 403c which have lower carrier densities than the second oxide semiconductor layer 403b. In this structure, the channel can be formed away from the interface with the insulating layer in contact with the stack 403 of oxide semiconductor layers, i.e., a buried channel can be formed; thus, the field-effect mobility of the transistor can be improved.

Further, this structure prevents formation of a trap level at the interface of the second oxide semiconductor layer 403b functioning as the channel, and thus enables the transistor to have high reliability.

The structures, methods, and the like described in this embodiment can be combined as appropriate with any of the structures, methods, and the like described in the other embodiments.

Embodiment 8

A semiconductor device having a display function (also referred to as a display device) can be manufactured using the transistor described in Embodiment 1 or 7. Further, part or all of the driver circuitry which includes the transistor can be formed over a substrate where a pixel portion is formed, whereby a system-on-panel can be formed.

Figure 11A:
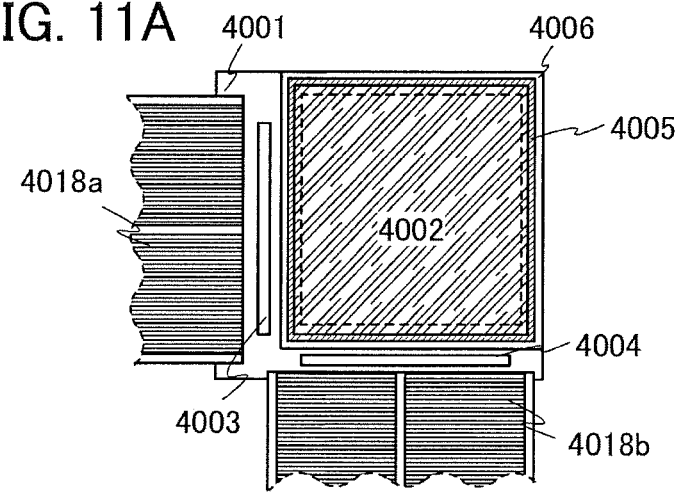
FIGS. 11A to 11C are top views illustrating one embodiment of the present invention.

In FIG. 11A, a sealant 4005 is provided so as to surround a pixel portion 4002 provided over a substrate 4001, and the pixel portion 4002 is sealed with a substrate 4006. In FIG. 11A, a scan line driver circuit 4004 and a signal line driver circuit 4003 which are each formed using a single crystal semiconductor film or a polycrystalline semiconductor film over an IC chip or a substrate separately prepared are mounted on the substrate 4001, in a region that is different from the region surrounded by the sealant 4005. Various signals and potentials are supplied to the pixel portion 4002 through the signal line driver circuit 4003 and the scan line driver circuit 4004 from flexible printed circuits (FPCs) 4018a and 4018b.

Figure 11B:
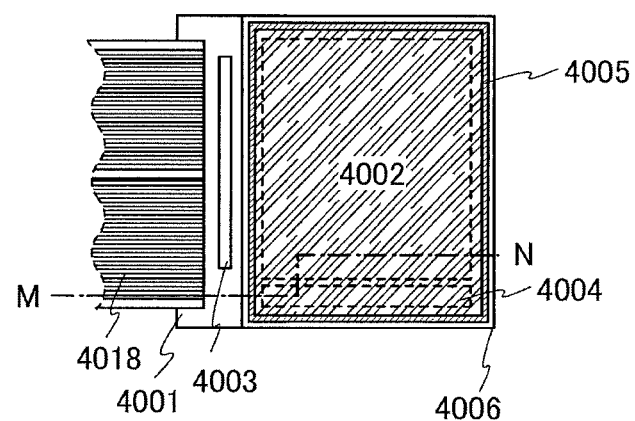
Figure 11C:
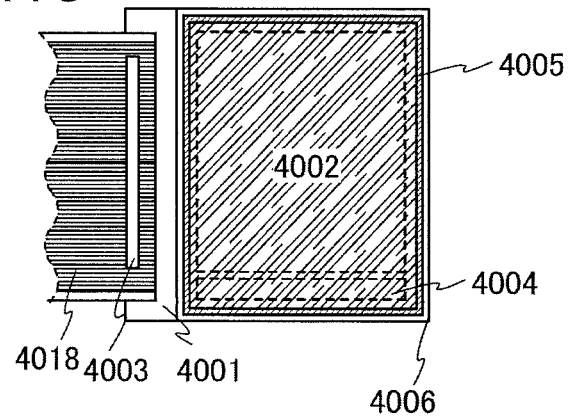

In FIGS. 11B and 11C, the sealant 4005 is provided to surround the pixel portion 4002 and the scan line driver circuit 4004 which are provided over the substrate 4001. The substrate 4006 is provided over the pixel portion 4002 and the scan line driver circuit 4004. Consequently, the pixel portion 4002 and the scan line driver circuit 4004 are sealed together with a display element by the substrate 4001, the sealant 4005, and the substrate 4006. In FIGS. 11B and 11C, the signal line driver circuit 4003 which is formed using a single crystal semiconductor film or a polycrystalline semiconductor film over an IC chip or a substrate separately prepared is mounted on the substrate 4001, in a region that is different from the region surrounded by the sealant 4005. In FIGS. 11B and 11C, various signals and potentials are supplied to the pixel portion 4002 through the signal line driver circuit 4003 and the scan line driver circuit 4004 from an FPC 4018.

Although FIGS. 11B and 11C each illustrate an example in which the signal line driver circuit 4003 is formed separately and mounted on the substrate 4001, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 11A shows an example in which the signal line driver circuit 4003 and the scan line driver circuit 4004 are mounted by a COG method. FIG. 11B shows an example in which the signal line driver circuit 4003 is mounted by a COG method. FIG. 11C shows an example in which the signal line driver circuit 4003 is mounted by a TAB method.

Note that the display device includes in its category a panel in which the display element is sealed and a module in which an IC including a controller or the like is mounted on the panel. That is, a display device in this specification means an image display device, a display device, or a light source (including a lighting device). Furthermore, the display device also includes the following modules in its category: a module to which a connector such as an FPC, a TAB, or a TCP is attached; a module having a TAB or a TCP at the tip of which a printed wiring board is provided; and a module in which an integrated circuit (IC) is directly mounted on a display element by a COG method.

The pixel portion and the scan line driver circuit provided over the substrate include a plurality of transistors, and the transistor described in Embodiment 1 or 7 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes an inorganic electroluminescent (EL) element, an organic EL element, and the like. Furthermore, a display medium whose contrast is changed by an electric effect, such as an electronic ink display device (electronic paper), can be used.

Embodiments of the semiconductor device are described with reference to FIGS. 11A to 11C and FIGS. 12A and 12B. FIGS. 12A and 12B correspond to cross-sectional views along line M-N in FIG. 11B. Examples of a liquid crystal display device using a liquid crystal element as a display element are illustrated in FIGS. 12A and 12B.

A liquid crystal display device can employ a vertical electric field mode or a horizontal electric field mode. FIG. 12A illustrates an example in which a vertical electric field mode is employed, and FIG. 12B illustrates and example in which a fringe field switching (FFS) mode, which is one of horizontal electric field modes, is employed.

Note that a transistor 4010 provided in the pixel portion 4002 is electrically connected to a display element to form a display panel. A variety of display elements can be used as the display element as long as display can be performed.

As illustrated in FIGS. 11A to 11C and FIGS. 12A and 12B, the semiconductor device includes a connection terminal electrode 4015 and a terminal electrode 4016. The connection terminal electrode 4015 and the terminal electrode 4016 are electrically connected to a terminal included in the FPC 4018 or 4018b through an anisotropic conductive layer 4019.

The connection terminal electrode 4015 is formed from the same conductive layer as a first electrode layer 4034. The terminal electrode 4016 is formed from the same conductive layer as a gate electrode layer of the transistor 4010 and a transistor 4011.

The pixel portion 4002 and the scan line driver circuit 4004 provided over the substrate 4001 include a plurality of transistors. FIGS. 11A to 11C and FIGS. 12A and 12B illustrate the transistor 4010 included in the pixel portion 4002 and the transistor 4011 included in the scan line driver circuit 4004. In FIGS. 12A and 12B, insulating layers 4032a and 4032b are provided over the transistors 4010 and 4011.

In FIG. 12B, a planarization insulating layer 4040 is provided over the insulating layer 4032b, and an insulating layer 4042 is provided between the first electrode layer 4034 and the second electrode layer 4031.

The transistor described in Embodiment 1 or 7 can be applied to the transistor 4010 and the transistor 4011. In this embodiment, an example in which a transistor having a structure similar to that of the transistor 310 described in Embodiment 7 is used is described. The transistors 4010 and 4011 are bottom-gate transistors.

The transistors 4010 and 4011 each include a stacked-layer structure of a gate insulating layers 4020a and 4020b. In FIG. 12A, the gate insulating layers 4020a and 4020b of the transistors 4010 and 4011 and the insulating layers 4032a and 4032b provided over the transistors 4010 and 4011 extend below the sealant 4005 to cover an end portion of the connection terminal electrode 4015. In FIG. 12B, the gate insulating layer 4020a and the insulating layer 4032b extend below the sealant 4005 to cover the end portion of the connection terminal electrode 4015, and the insulating layer 4032b covers side surfaces of the gate insulating layer 4020b and the insulating layer 4032a. It is preferable to apply of a film (e.g., a silicon nitride film) having a blocking property against hydrogen or a compound containing hydrogen (e.g., water) to each of the gate insulating layer 4020a and the insulating layer 4032b because the film can prevent the entry of hydrogen or a compound containing hydrogen from the air or the like, resulting in an improvement in the reliability of the semiconductor device.

In each of the transistors 4010 and 4011, a second oxide semiconductor layer which functions as a current path (channel) is sandwiched between a first oxide semiconductor layer and a third oxide semiconductor layer which have different compositions from the second oxide semiconductor layer. Accordingly, each of the transistors 4010 and 4011 is a buried-channel transistor in which a current path is formed away from the interface with the insulating layer, and therefore has high field-effect mobility. In addition, each of the transistors 4010 and 4011 is a highly reliable transistor in which influence of an interface state which might be formed on the back channel side is reduced and photodegradation (e.g., negative-bias temperature stress photodegradation) is reduced.

Moreover, a conductive layer may be further provided so as to overlap with a channel formation region in the oxide semiconductor layer of the transistor 4011 for the driver circuit. When the conductive layer is provided so as to overlap with the channel formation region in the oxide semiconductor layer, the amount of change in the threshold voltage of the transistor 4011 can be further reduced. The conductive layer may have the same potential as or a potential different from that of a gate electrode layer of the transistor 4011, and can function as a second gate electrode layer. The potential of the conductive layer may be a minimum potential, GND, or 0 V, or the conductive layer may be in a floating state.

In addition, the conductive layer has a function of blocking an external electric field, that is, a function of preventing an external electric field (particularly, a function of preventing static electricity) from affecting the inside (a circuit portion including a transistor). A blocking function of the conductive layer can prevent variation in the electrical characteristics of the transistor due to an influence of an external electric field such as static electricity.

In FIGS. 12A and 12B, a liquid crystal element 4013 includes a first electrode layer 4034, a second electrode layer 4031, and a liquid crystal layer 4008. Note that insulating layers 4033 and 4038 functioning as alignment films are provided so that the liquid crystal layer 4008 is positioned therebetween.

In FIG. 12A, the second electrode layer 4031 is provided on the substrate 4006 side, and the first electrode layer 4034 and the second electrode layer 4031 are stacked with the liquid crystal layer 4008 provided therebetween. In FIG. 12B, the second electrode layer 4031 having an opening pattern is provided below the liquid crystal layer 4008, and the first electrode layer 4034 having a flat plate shape is provided below the second electrode layer 4031 with the insulating layer 4042 provided therebetween. In FIG. 12B, the second electrode layer 4031 having an opening pattern includes a bent portion or a comb-shaped portion. An arrangement of the first electrode layer 4034 and the second electrode layer 4031, which complies with both conditions that they have the same shape and they completely overlap with each other, is avoided in order to generate an electric field between the electrodes. Note that a structure may be employed in which the second electrode layer 4031 having a flat plate shape is formed on and in contact with the planarization insulating layer 4040, and the first electrode layer 4034 having an opening pattern and serving as a pixel electrode is formed over the second electrode layer 4031 with the insulating layer 4042 provided therebetween.

The first electrode layer 4034 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

Alternatively, the first electrode layer 4034 and the second electrode layer 4031 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

A spacer 4035 is a columnar spacer obtained by selective etching of an insulating layer and is provided in order to control the thickness of the liquid crystal layer 4008 (a cell gap). Alternatively, a spherical spacer may be used.

In the case where a liquid crystal element is used as the display element, a thermotropic liquid crystal, a ferroelectric liquid crystal, an anti-ferroelectric liquid crystal, or the like can be used. These liquid crystal materials may be a low molecular compound or a high molecular compound. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4034 and the second electrode layer 4031. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral material. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is greater than or equal to $1 \times 10^9$ Ω·cm, preferably greater than or equal to $1 \times 10^{11}$ Ω·cm, more preferably greater than or equal to $1 \times 10^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using a transistor including an oxide semiconductor layer, which is disclosed in this specification, it is enough to provide a storage capacitor having a capacitance that is ⅓ or less, preferably ⅕ or less of liquid crystal capacitance of each pixel.

In the transistor including an oxide semiconductor layer, which is disclosed in this specification, the current in an off state (off-state current) can be made small. Accordingly, an electric signal such as an image signal can be held for a longer period and a writing interval can be set longer. Accordingly, the frequency of refresh operation can be reduced, which leads to an effect of suppressing power consumption.

The transistor including an oxide semiconductor layer, which is disclosed in this specification, can have high field-effect mobility; thus, the transistor can operate at high speed. For example, when such a transistor is used for a liquid crystal display device, a switching transistor in a pixel portion and a driver transistor in a driver circuit portion can be formed over one substrate. In addition, by using such a transistor in a pixel portion, a high-quality image can be provided.

For the liquid crystal display device, a twisted nematic (TN) mode, an in-plane-switching (IPS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements.

Note that one embodiment of the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an organic EL element is used as a light-emitting element.

In order to extract light emitted from the light-emitting element, at least one of the pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

Figure 13A:
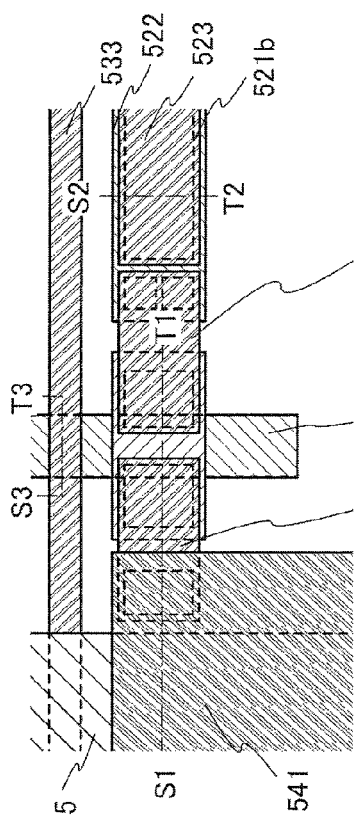
FIGS. 13A and 13B are a top view and a cross-sectional view illustrating one embodiment of the present invention.
Figure 13B:
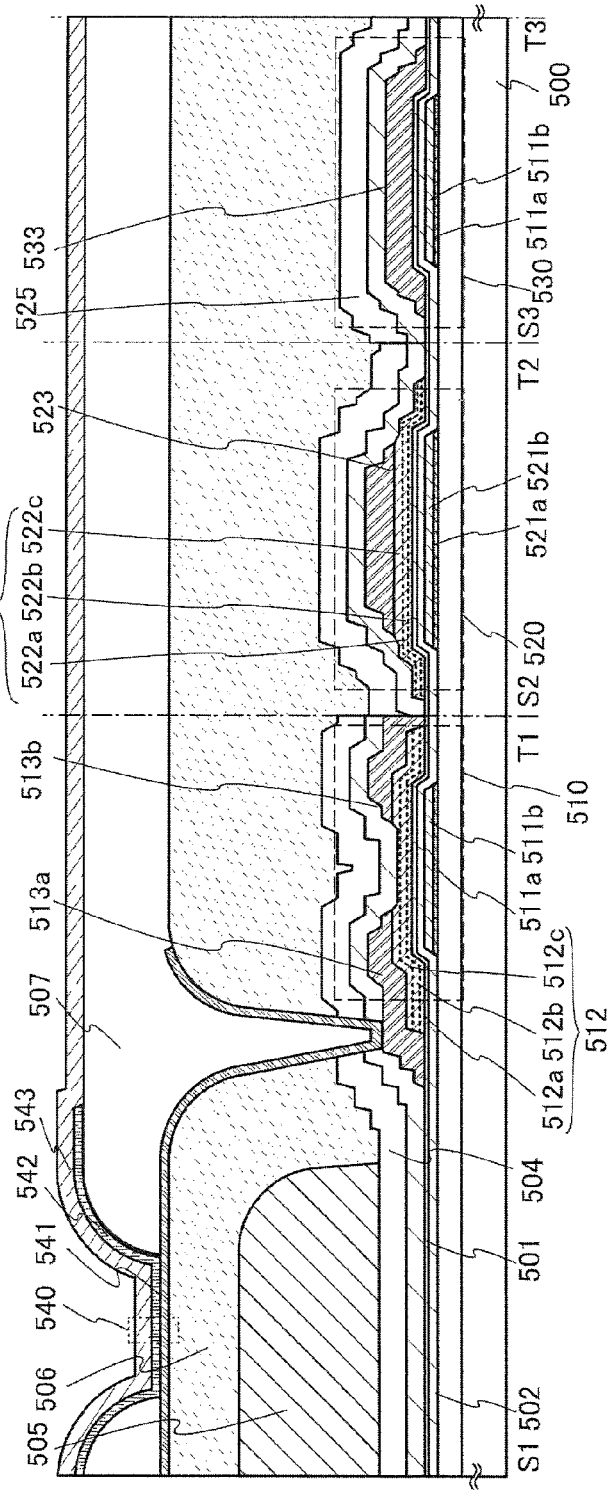

FIGS. 13A and 13B illustrate an example of a light-emitting device using a light-emitting element as a display element.

FIG. 13A is a plan view of the light-emitting device, and FIG. 13B is a cross-sectional view taken along dashed-dotted lines S1-T1, S2-T2, and S3-T3 in FIG. 13A. Note that an electroluminescent layer 542 and a second electrode layer 543 are not illustrated in the plan view in FIG. 13A.

The light-emitting device illustrated in FIGS. 13A and 13B includes, over a substrate 500, a transistor 510, a capacitor 520, and a wiring layer intersection 530. The transistor 510 is electrically connected to a light-emitting element 540. Note that FIGS. 13A and 13B illustrate a bottom-emission light-emitting device in which light from the light-emitting element 540 is extracted through the substrate 500.

The transistor described in Embodiment 1 or 7 can be applied to the transistor 510. In this embodiment, an example in which a transistor having a structure similar to that of the transistor 310 described in Embodiment 7 is used is described. The transistor 510 is a bottom-gate transistor.

The transistor 510 includes gate electrode layers 511a and 511b; gate insulating layers 501 and 502; an stack of oxide semiconductor layers 512 including a first oxide semiconductor layer 512a, a second oxide semiconductor layer 512b, and a third oxide semiconductor layer 512c; and conductive layers 513a and 513b serving as a source electrode layer and a drain electrode layer. In addition, an insulating layer 525 is formed over the transistor 510.

The capacitor 520 includes conductive layers 521a and 521b; the gate insulating layers 501 and 502; a stack of oxide semiconductor layers 522 including a first oxide semiconductor layer 522a, a second oxide semiconductor layer 522b, and a third oxide semiconductor layer 522c; and a conductive layer 523. The gate insulating layers 501 and 502 and the stack of oxide semiconductor layers 522 are sandwiched between the conductive layer 523 and the conductive layers 521a and 521b, whereby the capacitor is formed.

The wiring layer intersection 530 is an intersection of a conductive layer 533 and the gate electrode layers 511a and 511b. The conductive layer 533 and the gate electrode layers 511a and 511b intersect with each other with the gate insulating layers 501 and 502 provided therebetween.

In this embodiment, a 30-nm-thick titanium film is used as each of the gate electrode layer 511a and the conductive layer 521a, and a 200-nm-thick copper film is used as each of the gate electrode layer 511b and the conductive layer 521b. Thus, the gate electrode layer has a stacked-layer structure of the titanium film and the copper film.

In the transistor 510, a second oxide semiconductor layer which functions as a current path (channel) is sandwiched between a first oxide semiconductor layer and a third oxide semiconductor layer which have different compositions from the second oxide semiconductor layer. Accordingly, the transistor 510 is a buried-channel transistor in which a current path is formed away from the interface with the insulating layer, and therefore has high field-effect mobility. In addition, the transistor 510 is a highly reliable transistor in which influence of an interface state which might be formed on the back channel side is reduced and photodegradation (e.g., negative-bias temperature stress photodegradation) is reduced.

An interlayer insulating layer 504 is formed over the transistor 510, the capacitor 520, and the wiring layer intersection 530. Over the interlayer insulating layer 504, a color filter layer 505 is provided in a region overlapping with the light-emitting element 540. An insulating layer 506 functioning as a planarization insulating layer is provided over the interlayer insulating layer 504 and the color filter layer 505.

The light-emitting element 540 having a stacked-layer structure in which a first electrode layer 541, the electroluminescent layer 542, and the second electrode layer 543 are stacked in this order is provided over the insulating layer 506. The first electrode layer 541 and the conductive layer 513a are in contact with each other in an opening formed in the insulating layer 506 and the interlayer insulating layer 504, which reaches the conductive layer 513a; thus the light-emitting element 540 and the transistor 510 are electrically connected to each other. Note that a partition 507 is provided so as to cover part of the first electrode layer 541 and the opening.

Further, a 1500-nm-thick photosensitive acrylic film and a 1500-nm-thick photosensitive polyimide film can be used as the insulating layer 506 and the partition 507, respectively.

As the color filter layer 505, for example, a chromatic color light-transmitting resin can be used. As the chromatic color light-transmitting resin, a photosensitive organic resin or a non-photosensitive organic resin can be used. The photosensitive organic resin is preferably used, in which case the number of resist masks can be reduced, which results in the simplification of the process.

Chromatic colors are all colors except achromatic colors such as black, gray, and white. The color filter layer is formed using a material which transmits only light of the chromatic colors. As chromatic color, red, green, blue, or the like can be used. Alternatively, cyan, magenta, yellow, or the like may also be used. "Transmitting only light of a chromatic color" means that light passing through the color filter layer has a peak at a wavelength of the light of the chromatic color. The thickness of the color filter layer may be controlled as appropriate in consideration of the relationship between the concentration of the coloring material to be included and the transmittance of light. For example, the color filter layer 505 may have a thickness greater than or equal to 1500 nm and less than or equal to 2000 nm.

The partition 507 can be formed using an organic insulating material or an inorganic insulating material. It is particularly preferable that the partition 507 be formed using a photosensitive resin material to have an opening over the first electrode layer 541. A sidewall of the opening is preferably formed as a tilted surface with continuous curvature.

The electroluminescent layer 542 may be formed using either a single layer or a stack of a plurality of layers.

A protective film may be formed over the second electrode layer 543 and the partition 507 in order to prevent entry of oxygen, hydrogen, moisture, carbon dioxide, or the like into the light-emitting element 540. As the protective film, a silicon nitride film, a silicon nitride oxide film, a DLC film, or the like can be formed.

Further, the light-emitting element 540 may be covered with a layer containing an organic compound deposited by an evaporation method so that oxygen, hydrogen, moisture, carbon dioxide, or the like do not enter the light-emitting element 540.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The insulating layer 506 functioning as a planarization insulating layer can be formed using an organic material having heat resistance, such as an acrylic resin, polyimide, a benzocyclobutene-based resin, polyamide, or an epoxy resin. Other than such organic materials, it is also possible to use a low-dielectric constant material (low-k material) such as a siloxane-based resin, phosphosilicate glass (PSG), or borophosphosilicate glass (BPSG). Note that the insulating layer 506 may be formed by stacking a plurality of insulating layers formed using any of these materials.

There is no particular limitation on the method of forming the insulating layer 506; the following method can be used depending on the material: a sputtering method, spin coating, dipping, spray coating, a droplet discharge method (such as an inkjet method), screen printing, offset printing, or the like.

Materials similar to those of the first electrode layer 4034 and the second electrode layer 4031 illustrated in FIG. 12A or FIG. 12B can be used for the first electrode layer 541 and the second electrode layer 543.

In this embodiment, since the light-emitting device illustrated in FIGS. 13A and 13B has a bottom-emission structure, the first electrode layer 541 has a light-transmitting property and the second electrode layer 543 has a light-reflecting property. Accordingly, in the case of using a metal film as the first electrode layer 541, the film is preferably made thin enough to secure a light-transmitting property; and in the case of using a light-transmitting conductive layer as the second electrode layer 543, a light-reflecting conductive layer is preferably stacked therewith.

A protection circuit for protecting the driver circuit may be provided. The protection circuit is preferably formed using a nonlinear element.

By using the transistor described in Embodiment 7 as described above, the semiconductor device can have a variety of functions.

Embodiment 9

A semiconductor device disclosed in this specification can be applied to a variety of electronic devices (including game machines). Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electric appliances. Examples of the moving objects include electric vehicles (EV), hybrid electric vehicles (REV) which include both an internal-combustion engine and a motor, plug-in hybrid electric vehicles (PREY), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 14A to 14C and FIGS. 15A to 15C.

Figure 14A:
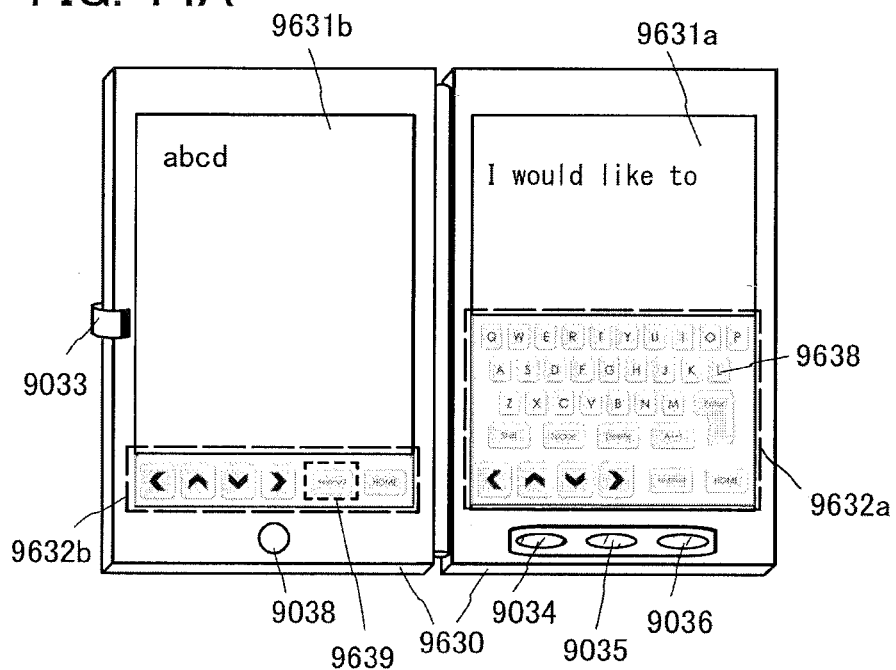
FIGS. 14A to 14C illustrate electronic devices.
Figure 14B:
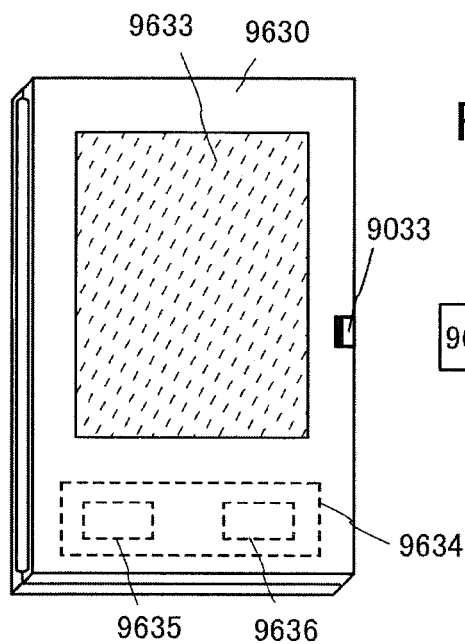

FIGS. 14A and 14B illustrate a tablet terminal that can be folded in two. FIG. 14A illustrates the tablet terminal which is open (unfolded). The tablet terminal includes a housing 9630, a display portion 9631a, a display portion 9631b, a switch 9034 for switching display modes, a power switch 9035, a switch 9036 for switching to power-saving mode, a fastener 9033, and an operation switch 9038.

In such a portable device illustrated in FIGS. 14A and 14B, an SRAM or a DRAM is used as a memory for temporarily storing image data. For example, the semiconductor device described in Embodiment 5 can be used as a memory. The semiconductor device described in the above embodiment employed for the memory element enables writing and reading of data to be performed at high speed, enables data to be retained for a long time, and enables power consumption to be sufficiently reduced. A CPU for performing image processing or arithmetic processing is used in the portable device illustrated in FIGS. 14A and 14B. As the CPU, the CPU described in Embodiment 6 can be used. In the case where the CPU described in Embodiment 6 is used, power consumption of the portable device can be reduced.

A touch panel region 9632a can be provided in a part of the display portion 9631a, in which data can be input by touching displayed operation keys 9638. Note that FIG. 14A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes allows switching between a landscape mode and a portrait mode, color display and black-and-white display, and the like. With the switch 9036 for switching to power-saving mode, the luminance of display can be optimized in accordance with the amount of external light at the time when the tablet is in use, which is detected with an optical sensor incorporated in the tablet. The tablet terminal may include another detection device such as a sensor for detecting orientation (e.g., a gyroscope or an acceleration sensor) in addition to the optical sensor.

Although FIG. 14A shows the example where the display area of the display portion 9631a is the same as that of the display portion 9631b, there is no particular limitation on the display portions 9631a and 9631b. They may differ in size and/or image quality. For example, one of them may be a display panel that can display higher-definition images than the other.

FIG. 14B illustrates the tablet terminal which is closed. The tablet terminal includes the housing 9630, a solar battery 9633, a charge/discharge control circuit 9634, a battery 9635, and a DC-DC converter 9636. As an example, FIG. 14B illustrates the charge/discharge control circuit 9634 including the battery 9635 and the DC-DC converter 9636.

Since the tablet terminal can be folded in two, the housing 9630 can be closed when the tablet is not in use. Thus, the display portions 9631a and 9631b can be protected, thereby providing a tablet terminal with high endurance and high reliability for long-term use.

The tablet terminal illustrated in FIGS. 14A and 14B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630 and the battery 9635 can be charged efficiently. When a lithium ion battery is used as the battery 9635, there is an advantage of downsizing or the like.

Figure 14C:
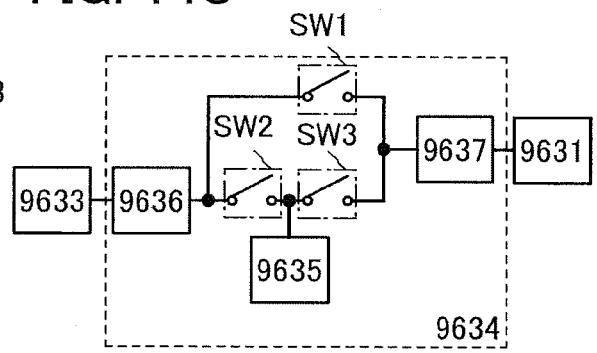

The structure and operation of the charge/discharge control circuit 9634 illustrated in FIG. 14B are described with reference to a block diagram in FIG. 14C. FIG. 14C illustrates the solar battery 9633, the battery 9635, the DC-DC converter 9636, a converter 9637, switches SW1 to SW3, and the display portion 9631. The battery 9635, the DC-DC converter 9636, the converter 9637, and the switches SW1 to SW3 correspond to the charge/discharge control circuit 9634 illustrated in FIG. 14B.

First, an example of operation in the case where power is generated by the solar battery 9633 using external light is described. The voltage of power generated by the solar battery 9633 is raised or lowered by the DC-DC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Figure 15A:
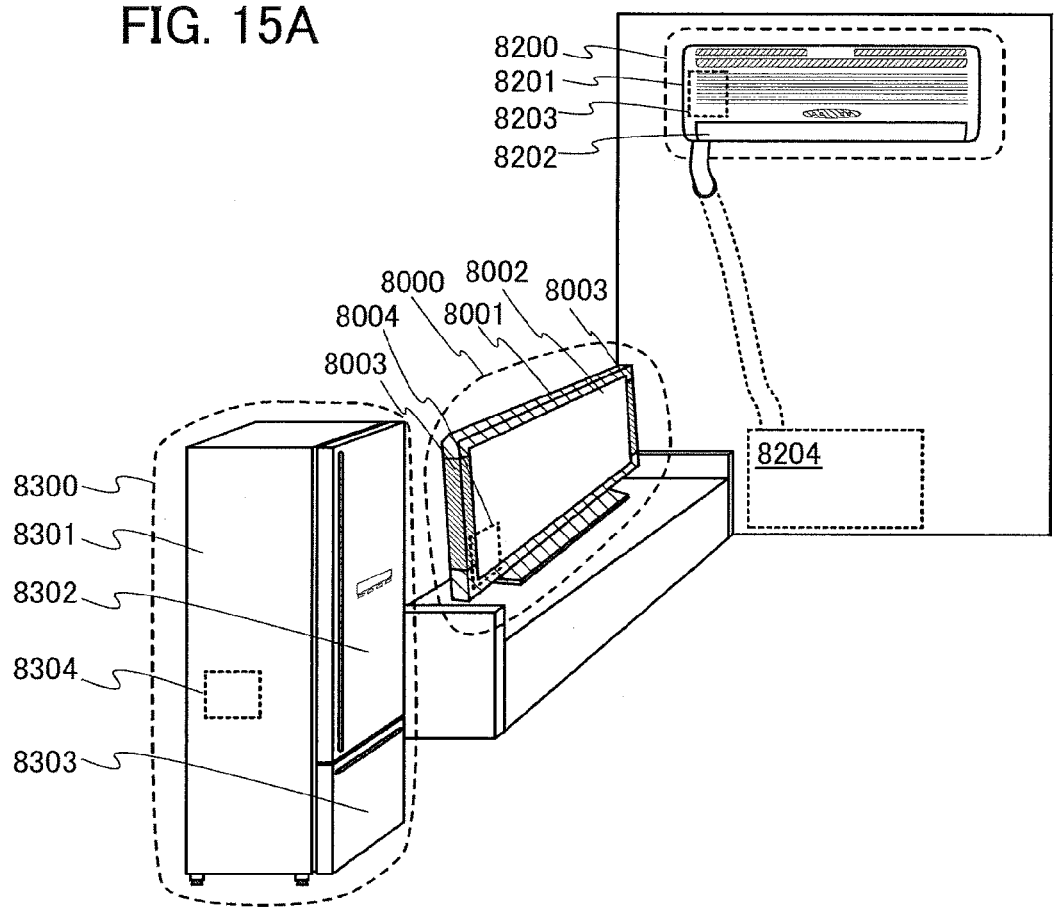
FIGS. 15A to 15C illustrate electronic devices.

In a television set 8000 in FIG. 15A, a display portion 8002 is incorporated in a housing 8001. The display portion 8002 displays an image and a speaker portion 8003 can output sound.

A display device such as a liquid crystal display device, a light-emitting device in which a light-emitting element such as an organic EL element is provided in each pixel, or the like described in Embodiment 8 can be used for the display portion 8002.

The television set 8000 may be provided with a receiver, a modem, and the like. With the receiver, the television set 8000 can receive general television broadcasting. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The memory described in Embodiment 4 or the CPU described in Embodiment 6 can be used in the television set 8000.

In FIG. 15A, an air conditioner which includes an indoor unit 8200 and an outdoor unit 8204 is an example of an electric appliance in which the CPU of Embodiment 6 is used. Specifically, the indoor unit 8200 includes a housing 8201, an air outlet 8202, a CPU 8203, and the like. Although the CPU 8203 is provided in the indoor unit 8200 in FIG. 15A, the CPU 8203 may be provided in the outdoor unit 8204. Alternatively, the CPU 8203 may be provided in both the indoor unit 8200 and the outdoor unit 8204. By using the CPU described in Embodiment 6 as the CPU in the air conditioner, power consumption can be reduced.

In FIG. 15A, an electric refrigerator-freezer 8300 is an example of an electric appliance which is provided with the CPU formed using an oxide semiconductor. Specifically, the electric refrigerator-freezer 8300 includes a housing 8301, a door for a refrigerator 8302, a door for a freezer 8303, a CPU 8304, and the like. In FIG. 15A, the CPU 8304 is provided in the housing 8301. When the CPU described in Embodiment 6 is used as the CPU 8304 of the electric refrigerator-freezer 8300, power consumption of the electric refrigerator-freezer 8300 can be reduced.

Figure 15B:
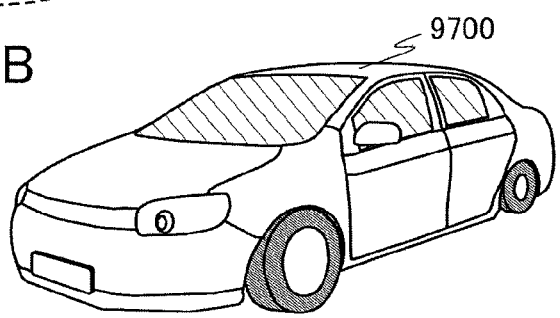
Figure 15C:
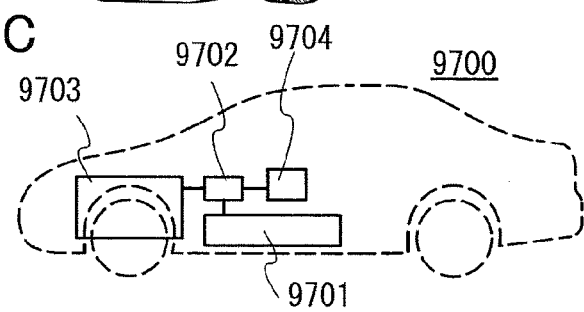
Figure 16A:
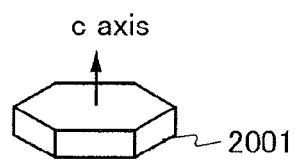
FIG. 16A is a schematic view of a flat-plate-like sputtered particle.
Figure 16B:
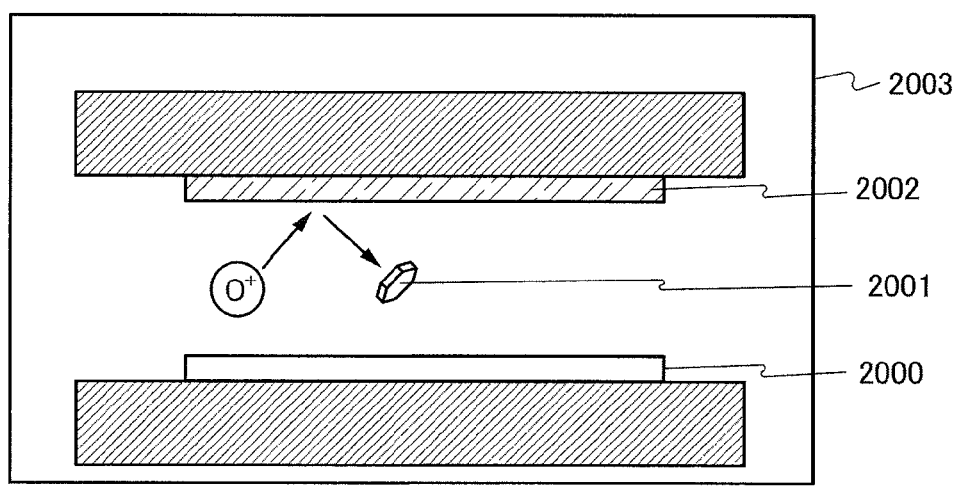
FIG. 16B is a model diagram during deposition.
Figure 16C:
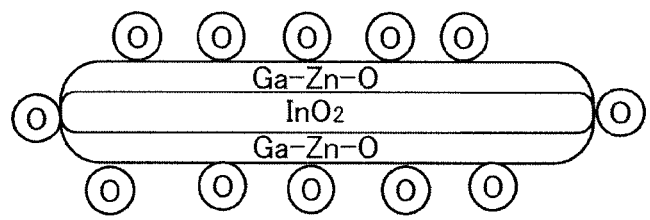
FIG. 16C is a model diagram showing the state of the flat-plate-like sputtered particle.
Figure 17A:
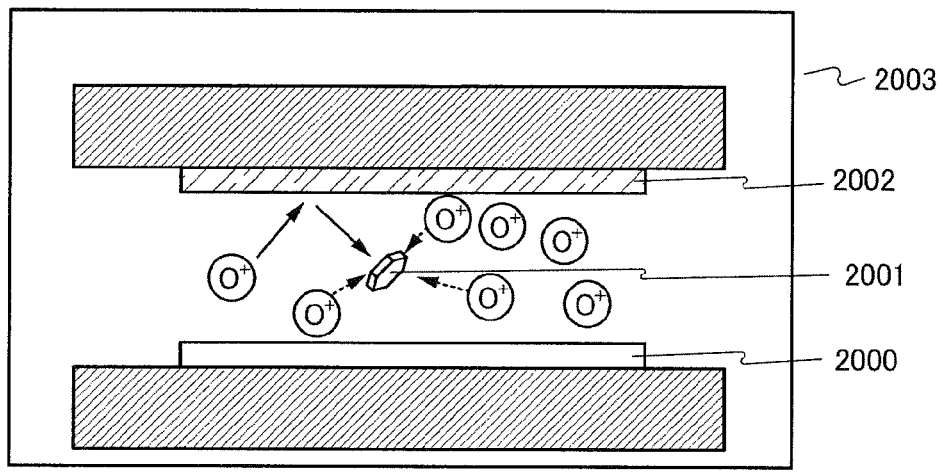
FIG. 17A is a model diagram during deposition and FIG. 17B is a model diagram showing the state where oxygen of a flat-plate-like sputtered particle is released.
Figure 17B:
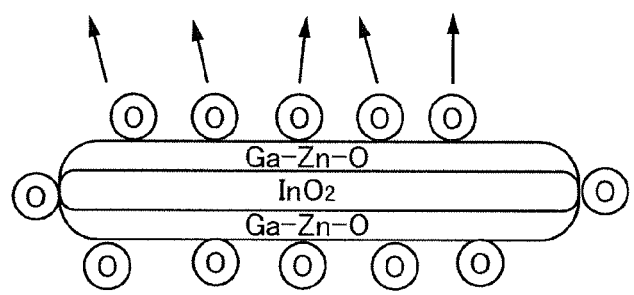

An example of an electric vehicle which is an example of an electric appliance is described in FIG. 15B. An electric vehicle 9700 is equipped with a secondary battery 9701. The output of power of the non-aqueous secondary battery 9701 is adjusted by a control circuit 9702 and the power is supplied to a driving device 9703. The control circuit 9702 is controlled by a processing unit 9704 including a ROM, a RAM, a CPU, or the like which is not illustrated. When the CPU described in Embodiment 6 is used as the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented in combination with any of the other embodiments, as appropriate.

This application is based on Japanese Patent Application serial No. 2012-152794 filed with Japan Patent Office on Jul. 6, 2012, the entire contents of which are hereby incorporated by reference.

What is claimed is:

1. A semiconductor device comprising:
   a first insulating layer over an insulating surface;
   a first oxide semiconductor layer over the first insulating layer;
   a second oxide semiconductor layer over the first oxide semiconductor layer;
   a third oxide semiconductor layer over the second oxide semiconductor layer;
   a second insulating layer over the third oxide semiconductor layer, and
   a first gate electrode layer over the second insulating layer,
   wherein an energy level of a bottom of a conductive band of the first oxide semiconductor layer is continuously changed to an energy level of a bottom of a conductive band of the second oxide semiconductor layer at an interface between the second oxide semiconductor layer and the first oxide semiconductor layer, and
   wherein a composition of the second oxide semiconductor layer is different from compositions of the first oxide semiconductor layer and the third oxide semiconductor layer.

2. The semiconductor device according to claim 1, wherein the energy level of a bottom of the bottom of the conductive band of the second oxide semiconductor layer is continuously changed to an energy of a bottom of a conductive band of the third oxide semiconductor layer at an interface between the second oxide semiconductor layer and the third oxide semiconductor layer.

3. The semiconductor device according to claim 1, wherein a thickness of the first oxide semiconductor layer is smaller than a thickness of the second oxide semiconductor layer.

4. The semiconductor device according to claim 1, wherein a thickness of the first oxide semiconductor layer is smaller than a thickness of the third oxide semiconductor layer.

5. The semiconductor device according to claim 1, further comprising a second gate electrode layer between the insulating surface and the first insulating layer.

6. The semiconductor device according to claim 1, further comprising a third insulating layer over the second insulating layer,
   wherein the third insulating layer is a nitride insulating film, and
   wherein the second insulating layer is an oxide insulating film.

7. A semiconductor device comprising:
   a first insulating layer over an insulating surface;
   a first oxide semiconductor layer over the first insulating layer;
   a second oxide semiconductor layer over the first oxide semiconductor layer;
   a third oxide semiconductor layer over the second oxide semiconductor layer; and
   a second insulating layer over the third oxide semiconductor layer,
   wherein an energy level of a bottom of a conductive band of the first oxide semiconductor layer is continuously changed to an energy level of a bottom of a conductive band of the second oxide semiconductor layer at an interface between the second oxide semiconductor layer and the first oxide semiconductor layer, and
   wherein a thickness of a region of the first insulating layer which overlaps with the first oxide semiconductor layer is larger than a thickness of a region of the first insulating layer which does not overlap with the first oxide semiconductor layer.

8. The semiconductor device according to claim 7, wherein the energy level of a bottom of the bottom of the conductive band of the second oxide semiconductor layer is continuously changed to an energy of a bottom of a conductive band of the third oxide semiconductor layer at an interface between the second oxide semiconductor layer and the third oxide semiconductor layer.

9. The semiconductor device according to claim 7, wherein a composition of the second oxide semiconductor layer is different from compositions of the first oxide semiconductor layer and the third oxide semiconductor layer.

10. The semiconductor device according to claim 7, wherein a thickness of the first oxide semiconductor layer is smaller than a thickness of the second oxide semiconductor layer.

11. The semiconductor device according to claim 7, wherein a thickness of the first oxide semiconductor layer is smaller than a thickness of the third oxide semiconductor layer.

12. The semiconductor device according to claim 7, further comprising a gate electrode layer between the insulating surface and the first insulating layer.

13. The semiconductor device according to claim 7, further comprising a gate electrode layer over the second insulating layer.

14. The semiconductor device according to claim 7, further comprising:
- a first gate electrode layer between the insulating surface and the first insulating layer, and
- a second gate electrode layer over the second insulating layer.

15. The semiconductor device according to claim 7, further comprising a third insulating layer over the second insulating layer,
- wherein the third insulating layer is a nitride insulating film, and
- wherein the second insulating layer is an oxide insulating film.

16. A semiconductor device comprising:
- a gate electrode layer;
- a gate insulating layer over the gate electrode layer;
- a first oxide semiconductor layer over the gate insulating layer;
- a second oxide semiconductor layer over the first oxide semiconductor layer, and
- a source electrode layer and a drain electrode layer over the second oxide semiconductor layer,
- wherein each of the first oxide semiconductor layer and the second oxide semiconductor layer comprises In, Ga, and Zn,
- wherein an energy level of a bottom of a conductive band of the first oxide semiconductor layer is continuously changed to an energy level of a bottom of a conductive band of the second oxide semiconductor layer at an interface between the second oxide semiconductor layer and the first oxide semiconductor layer, and
- wherein a composition of the second oxide semiconductor layer is different from compositions of the first oxide semiconductor layer.

17. A semiconductor device comprising:
- a gate electrode layer;
- a gate insulating layer over the gate electrode layer;
- a first oxide semiconductor layer over the gate insulating layer;
- a second oxide semiconductor layer over the first oxide semiconductor layer, and
- a source electrode layer and a drain electrode layer over the second oxide semiconductor layer,
- wherein each of the first oxide semiconductor layer and the second oxide semiconductor layer comprises In, Ga, and Zn,
- wherein the second oxide semiconductor layer comprises a plurality of c-axis aligned crystal parts,
- wherein an energy level of a bottom of a conductive band of the first oxide semiconductor layer is continuously changed to an energy level of a bottom of a conductive band of the second oxide semiconductor layer at an interface between the second oxide semiconductor layer and the first oxide semiconductor layer, and
- wherein a composition of the second oxide semiconductor layer is different from compositions of the first oxide semiconductor layer.

* * * * *